United States Patent [19]

Iwamuro et al.

[11] Patent Number: 5,874,751
[45] Date of Patent: Feb. 23, 1999

[54] INSULATED GATE THYRISTOR

[75] Inventors: Noriyuki Iwamuro; Yuichi Harada; Tadayoshi Iwaana, all of Nagano, Japan

[73] Assignee: Fuji Electric Co., Ltd., Japan

[21] Appl. No.: 626,335

[22] Filed: Apr. 2, 1996

[30] Foreign Application Priority Data

| Apr. 5, 1995 | [JP] | Japan | 7-079230 |
| Jun. 14, 1995 | [JP] | Japan | 7-147039 |
| Sep. 11, 1995 | [JP] | Japan | 7-232258 |
| Nov. 22, 1995 | [JP] | Japan | 7-304197 |

[51] Int. Cl.$^6$ .................... H01L 29/87; H01L 29/745
[52] U.S. Cl. .................... 257/140; 257/140; 257/152; 257/153; 257/172; 257/139
[58] Field of Search .................... 257/137, 138, 257/145, 148, 152, 153, 165, 166, 172, 140, 139

[56] References Cited

U.S. PATENT DOCUMENTS

| 5,014,102 | 5/1991 | Adler | 257/139 |
| 5,023,696 | 6/1991 | Ogino | 257/156 |
| 5,317,171 | 5/1994 | Shekar et al. | 257/138 |
| 5,319,222 | 6/1994 | Shekar et al. | 257/138 |
| 5,329,142 | 7/1994 | Kitagawa et al. | 257/137 |
| 5,391,898 | 2/1995 | Hagino | 257/138 |

FOREIGN PATENT DOCUMENTS

| 0622854A1 | 11/1994 | European Pat. Off. . |
| 4130889A1 | 3/1992 | Germany . |

OTHER PUBLICATIONS

Electronics Letters, 31 (1995) 16 Mar. No. 6,Stevenage, Herts Gb, pp. 494–496,XP000530337 S.Sridhar & B.J. Baliga Title.
Dual–channel EST/BRT:A new high–voltage MOS–gated thyristor structure.

Primary Examiner—Jerome Jackson, Jr.
Attorney, Agent, or Firm—Rossi & Associates

[57] ABSTRACT

An insulated gate thyristor is provided which includes a first-conductivity-type base layer of high resistivity, first and second second-conductivity-type base regions formed in a surface layer of a first major surface of the first-conductivity-type base layer, a first-conductivity-type source region formed in a surface layer of the first second-conductivity-type base region, a first-conductivity-type emitter region formed in a surface layer of the second second-conductivity-type base region, a gate electrode formed on surfaces of the first second-conductivity-type base region, the first-conductivity-type base layer, and the second second-conductivity-type base region, which surfaces are interposed between the first-conductivity-type source region and the first-conductivity-type emitter region, an insulating film interposed between the gate electrode and these surface of the base regions and layer, a first main electrode in contact with both the first second-conductivity-type base region and the first-conductivity-type source region, a second-conductivity-type emitter layer formed on a second major surface of the first-conductivity-type base layer, and a second main electrode in contact with the second-conductivity-type emitter layer. The entire surface areas of the second second-conductivity-type base region and the first-conductivity-type emitter region are covered with the insulating film.

27 Claims, 28 Drawing Sheets

INSULATED GATE THYRISTOR

FIELD OF THE INVENTION

The present invention relates in general to an insulated gate thyristor. More specifically, the invention relates to an insulated gate thyristor used as a power switching device.

BACKGROUND OF THE INVENTION

Thyristors have been used as indispensable devices for large capacity power switching owing to their low ON-state voltage characteristics. For example, GTO (gate turn-off) thyristors are widely used these days in high-voltage large-current range applications. The GTO thyristor, however, has revealed drawbacks as follows: first, the GTO thyristor requires a large gate current for turn off, in other words, the thyristor has a relatively small turn-off gain; and secondly, a large-sized snubber is needed to safely turn off the GTO thyristor. In addition, since the GTO thyristor does not show current saturation in its current-voltage characteristics, a passive component, such as a fuse, must be coupled to the thyristor so as to protect its load from short-circuiting. This greatly impedes the reduction in the size and cost of the whole system.

A MOS controlled thyristor (hereinafter abbreviated as MCT) as a voltage-driven type thyristor was disclosed by V. A. K. Temple in IEEE IEDM Tech. Dig., 1984, p282. Since then, the characteristics of this type of thyristor have been analyzed and improved in various institutions worldwide. This is because the MCT, which is a voltage-driven type of device, only requires a far simpler gate circuit than the GTO thyristor, while assuring a relatively low ON-state voltage characteristic. The MCT, however, does not show a current saturation characteristic, like the GTO thyristor, and therefore requires a passive component, such as a fuse, in its practical use.

M. S. Shekar and others proved through actual measurements in IEEE Electron Device Letters vol.12 (1991), p387, that a dual channel type emitter switched thyristor (EST-1) shows a current saturation characteristic even in a high voltage range. In Proceedings of IEEE ISPSD '93, p71 and Proceedings of IEEE ISPSD '94, p195, the inventors of the present invention disclosed results of their analysis with regard to a forward bias safe operation area (FBSOA) and a reverse bias safe operation area (RBSOA) of the EST, and paved the way to development of a device having the safe operation area in which the device operates safely even when a load is short-circuited. FIG. 43 shows the structure of this EST device.

In the device as shown in FIG. 43, a first p base region 4, a p$^+$ well region 5 and a second p base region 6 are formed in a surface layer of an n base layer 3 deposited on a p emitter layer 1 through an n$^+$ buffer layer 2. The p$^+$ well region 5 forms a part of the first p base layer 4, and has a relatively large diffusion depth. An n source region 7 is formed in a surface layer of the first p base region 4, and an n emitter layer 8 is formed in a surface layer of the second p base region 6. A gate electrode 10 is formed through a gate oxide film 9 over a portion of the first p base region 4 that is interposed between the n source region 7 and an exposed portion of the n base layer 3, and a portion of the second p base region 6 that is interposed between the n emitter region 8 and the exposed portion of the n base layer 3. The length of each of the n source region 7, n emitter region 8 and the gate electrode 10 is limited in the Z direction of FIG. 43, and the first p base region 4 and the second p base region 6 are connected to each other outside these regions 7, 8 and electrode 10. Further, the L-shaped p$^+$ well region 5 is formed outside the connected portion of the first and second p base regions 4, 6. A cathode 11 is formed in contact with both a surface of the p$^+$ well region 5, and a surface of the n source region 7. On the other hand, an anode 12 is formed over the entire area of the rear surface of the p emitter layer 1.

When the cathode 11 of this device is grounded, and positive voltage is applied to the gate electrode 10 while the anode 12 is biased positive, an inversion layer (partial accumulation layer) is formed under the gate oxide film 9, and a lateral MOSFET is thus turned on. As a result, electrons are fed from the cathode 11 to the n base layer 3, through the n source region 7, and a channel formed in a surface layer of the first p base region 4. These electrons function as a base current for a pnp transistor, which consists of the p emitter layer 1, the n$^+$ buffer layer 2 and n base layer 3, and the first and second p base regions 4, 6 and p$^+$ well region 5. This pnp transistor is operated with this base current. Part of holes injected from the p emitter layer 1 flow toward the second p base region 6, through the n$^+$ buffer layer 2 and n base layer 3, and then flow under the n emitter region 8 in the Z direction to the cathode 11. Thus, the device operates in an IGBT (insulated gate bipolar transistor) mode. With a further increase in the current, the pn junction between the n emitter region 8 and the second p base region 6 is forward biased, a built-in thyristor consisting of the p emitter layer 1, n$^+$ buffer layer 2, n base layer 3, second p base region 6 and the n emitter region 8 latches up. To turn off the EST, the MOSFET is switched off by lowering the potential of the gate electrode 10 below the threshold of the lateral MOSFET. As a result, the n emitter region 8 is potentially separated from the cathode 11, so that the operation of the thyristor is stopped.

Since the EST shown in FIG. 43 utilizes the holes flowing in the second p base region 6 in the Z direction so as to forward bias the pn junction between the second p base region 6 and the n emitter region 8, a degree or strength of the forward bias decreases in the Z direction toward a contact area of the second p base region 6 with the cathode 11. Namely, the amount of electrons injected from the n emitter region 8 is not uniform over the length of the pn junction in the Z direction. If this EST is switched from this ON-state to the OFF-state, a shallow or weakly biased portion of the pn junction near the contact area with the cathode 11 initially resumes its reverse-blocking ability, and a deeply biased portion of the junction remote from the contact area with the cathode 11 slowly resumes the same ability. This tends to cause current localization or concentration, resulting in reduced breakdown withstand capability of the EST at the time of turn off.

FIGS. 44 and 45 show improved ESTs as disclosed in U.S. Pat. Nos. 5,317,171 issued on May 31, 1994 and 5,319,222 issued on Jun. 7, 1994 to M. S. Shekar et al. Although the EST shown in FIG. 44 operates in the same manner as the EST of FIG. 43, the EST of FIG. 44 can be turned off more rapidly due to direct contact of the cathode 11 extending in the Y direction, with a surface of the second p base region 6. Further, the EST of FIG. 44 shows a uniform turn-off characteristic due to the absence of the hole current flowing in the Z direction. In the operation of this thyristor, however, the minority carriers are not uniformly injected along the horizontal direction (Y direction) when the pn junction between the n emitter region 8 and the second p base region 6 is turned on or forward biased, and therefore the ON-state voltage cannot be lowered to such an extent as expected. If the impurity concentration of the second p base region 6 is reduced to increase its resistance, for example, so as to solve this problem, a depletion layer is punched through the n emitter region 8 upon withstanding of the voltage applied in the forward direction. Thus the conventional EST cannot achieve a sufficient withstand voltage.

In the device shown in FIG. 45, the n emitter region 8 extends beyond the second p base region 6 so as to further lower the ON-state voltage. This structure, however, is unable to withstand the voltage applied in the forward direction.

The insulated gate thyristor used as a power switching element needs to have a low ON-state voltage and a high switching speed, so as to reduce losses.

It is therefore an object of the present invention to provide an insulated gate thyristor wherein the pn junction can uniformly resume its reverse-blocking ability upon turn off of the thyristor, to enhance the turn-off withstand capability, while assuring a sufficiently low ON-state voltage.

SUMMARY OF THE INVENTION

The above object may be accomplished according to a first aspect of the present invention, which provides an insulated gate thyristor comprising: a first-conductivity-type base layer of high resistivity; first and second second-conductivity-type base regions formed in spaced-apart selected areas of a surface layer of a first major surface of the first-conductivity-type base layer; a first-conductivity-type source region formed in a selected area of a surface layer of the first second-conductivity-type base region; a first-conductivity-type emitter region formed in a selected area of a surface layer of the second second-conductivity-type base region; a gate electrode formed on a surface of the first second-conductivity-type base region, an exposed portion of the first-conductivity-type base layer, and a surface of the second second-conductivity-type base region, which surfaces and exposed portion are interposed between the first-conductivity-type source region and the first-conductivity-type emitter region; an insulating film interposed between the gate electrode and the surface of the first second-conductivity-type base region, the exposed portion of the first-conductivity-type base layer and the surface of the second second-conductivity-type base region; a first main electrode in contact with both an exposed portion of the first second-conductivity-type base region and the first-conductivity-type source region; a second-conductivity-type emitter layer formed on a second major surface of the first-conductivity-type base layer; and a second main electrode in contact with the second-conductivity-type emitter layer; wherein the insulating film covering entire areas of surfaces of the second second-conductivity-type base region and the first-conductivity-type emitter region.

The above object may also be accomplished according to a second aspect of the present invention, which provides an insulated gate thyristor comprising; a first-conductivity-type base layer of high resistivity; first and second second-conductivity-type base regions formed in spaced-apart selected areas of a surface layer of a first major surface of the first-conductivity-type base layer; a first-conductivity-type source region formed in a selected area of a surface layer of the first second-conductivity-type base region; a first-conductivity-type emitter region formed in a selected area of a surface layer of the second second-conductivity-type base region; a trench formed between the first-conductivity-type emitter region and the first-conductivity-type source region, such that the trench has a greater depth than the first and second second-conductivity-type base regions; a gate electrode formed within the trench through a gate insulating film; a first main electrode in contact with both an exposed portion of the first second-conductivity-type base region and the first-conductivity-type source region; a second-conductivity-type emitter layer formed on a second major surface of the first-conductivity-type base layer; a second main electrode in contact with the second-conductivity-type emitter layer; and an insulating film covering an entire area of a surface of the first-conductivity-type emitter region.

In the insulated gate thyristor constructed as described above according to the present invention, an inversion layer appears right below the gate electrode upon application of voltage to the insulated gate electrode, and the potential of the first-conductivity-type emitter region becomes equal to that of the first main electrode, through channels of the MOSFET. Thus, a thyristor portion of the device including the first-conductivity-type emitter region, second second-conductivity-type base region, first-conductivity-type base layer and second-conductivity-type emitter layer is turned on. Since electrons are uniformly injected from the entire first-conductivity-type emitter region at the time of turn on, the device is rapidly shifted to the thyristor mode, and the ON-state voltage is thus reduced. This operation does not require the hole current flowing through the second second-conductivity-type base region in the Z direction as in the conventional EST. At the time of turn off, on the other hand, the pn junction uniformly resumes its reverse-blocking ability, thus preventing the current from being concentrated in a limited area, whereby the device has improved breakdown withstand capability.

In the insulated gate thyristor with trenches according to the second aspect of the invention, channels of the MOSFET can be vertically formed along side walls of each trench, resulting in a significantly reduced cell pitch.

In one preferred form of the first and second aspects of the invention, the first and second second-conductivity-type base regions are in the form of stripes which extend in parallel with each other. In another preferred form of the invention, at least one of the first and second second-conductivity-type base regions, the first-conductivity-type emitter region and the first-conductivity-type source region has one of polygonal, circular and elliptical shapes. In these cases, the semiconductor substrate is utilized with improved efficiency, and the current is uniformly distributed, resulting in improved thermal balance.

The first second-conductivity-type base region and the first-conductivity-type source region in its surface layer may be formed so as to surround the second second-conductivity-type base region. Alternatively, a plurality of first second-conductivity-type base regions and first-conductivity-type source regions in their surface layers may be formed around the second second-conductivity-type base region. In this case, a generally annular gate electrode may be disposed so as to surround the insulating film on the surface of the second second-conductivity-type base region, and the first main electrode may be located on the side of the gate electrode opposite to the second second-conductivity-type base region, with the insulating film interposed between the gate electrode and the first main electrode.

In the above arrangement, the current flowing from the first-conductivity-type emitter region to the first-conductivity-type source region through the channel is dispersed, without causing the current concentration, whereby the controllable current of the device is increased. Further, the ON-state voltage is reduced since the accumulation layer is formed in an increased area of the surface layer of the first-conductivity-type semiconductor layer (base layer) under the gate electrode.

The first-conductivity-type source region may not be formed in the surface layer of at least one of the first second-conductivity-type base regions. Since the first second-conductivity-type base region having no first-conductivity-type source region functions as a hole for drawing carriers, a parasitic thyristor is less likely to latch up, and the controllable current is increased.

If the width of the gate electrode above the first second-conductivity-type base region lacking the first-conductivity-type source region in its surface layer is smaller than that of the width of the gate electrode above the first second-conductivity-type base region having the first-conductivity-type source region in its surface layer, the above-indicated base region lacking the source region functions more effectively as a hole for drawing carriers.

Preferably, a contact area between the first main electrode, and the second-conductivity-type base region and the first-conductivity-type source region is one of polygonal, circular and elliptical shapes. In this case, the semiconductor substrate can be utilized with improved efficiency, and the current is uniformly distributed, resulting in improved thermal balance of the device.

In another preferred form of the invention, a plurality of units each having the gate electrode having at least one discontinuity in its circumference are formed so as to surround the second second-conductivity-type base region, such that the first second-conductivity-type base region, the first-conductivity-type source region and the cathode of one of the plurality of units are connected with corresponding ones of its adjacent unit, through the discontinuity or discontinuities. In this arrangement, the areas of the first second-conductivity-type base region and first-conductivity-type source region can be increased, with a result of reduced ON-state voltage.

In a further preferred form of the invention, a first portion of the first-conductivity-type source region which is close to the second second-conductivity-type base region is covered with the insulating film, and a second portion of the source region remote from the second second-conductivity-type base region is in contact with the cathode. In this arrangement, the current flowing from the first-conductivity-type emitter region to the first-conductivity-type source region through the channel formed right under the gate electrode is prevented from flowing in the above-indicated first portion close to the first-conductivity-type emitter region. As a result, a parasitic thyristor is less likely to latch up, and the controllable current can be thus increased.

The first-conductivity-type source region located below one edge of the gate electrode may include at least one disconnected portion. In this case, the first second-conductivity-type base region lacking the first-conductivity-type source region functions as a hole for drawing carriers, whereby the parasitic thyristor is given increased resistance to latch up.

The width of the gate electrode whose opposite ends are located above two of the first-conductivity-type source regions is preferably larger than that of the gate electrode whose opposite ends are located above the first-conductivity-type source region and the first-conductivity-type emitter region. In this case, the channel resistance at the time of turn on can be reduced, without increasing the resistance due to effects of the JFET during the initial period of the turn-on operation.

The insulated gate thyristor may further include a first-conductivity-type auxiliary region formed in a part of the surface layer of the first-conductivity-type base layer that is right under the insulating film in contact with the gate electrode. The auxiliary region has a higher impurity concentration than the first-conductivity-type base layer. This leads to a reduction in the channel resistance at the time of turn on, and accelerate dispersion of the current at the time of turn off, thus avoiding current concentration.

If the diffusion depth of the second second-conductivity-type base region is larger than that of the first second-conductivity-type base region, and the diffusion depth of the first-conductivity-type emitter region is larger than that of the first-conductivity-type source region, the current amplification factor of an npn transistor of the thyristor portion is increased, with a result of reduction of the ON-state voltage.

Further, lifetime killers may be present in local areas of the insulated gate thyristor of the present invention. Thus, the lifetime distribution of carriers can be optimally controlled so that the lifetime killers do not appear in unnecessary portions, thereby eliminating adverse influences, such as an increase in the ON-state voltage, due to the unnecessary lifetime killers.

BRIEF DESCRIPTION OF THE DRAWINGS

The invention will be described in greater detail with reference to certain preferred embodiments thereof and the accompanying drawings, wherein.

Figure 13:
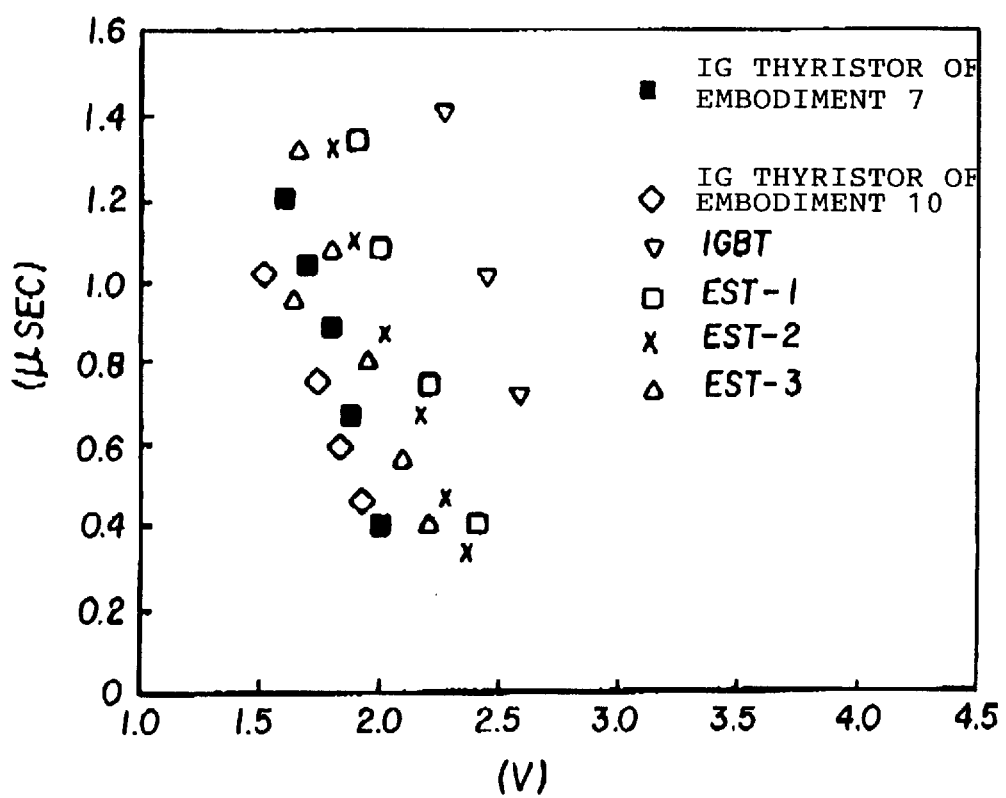
Figure 14:
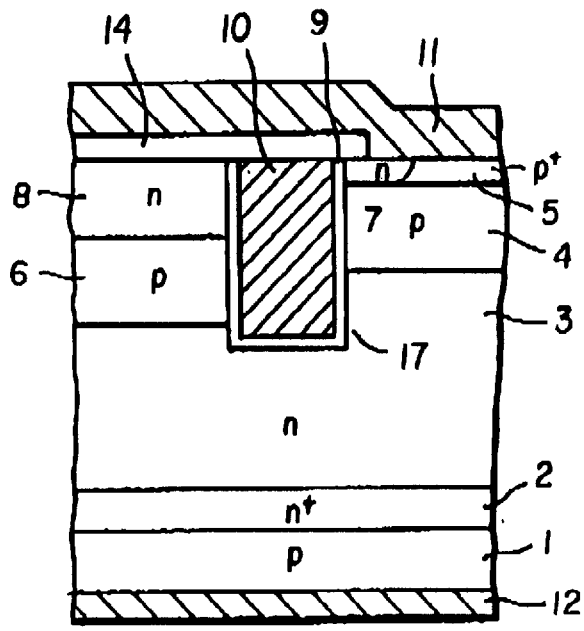
Figure 15:
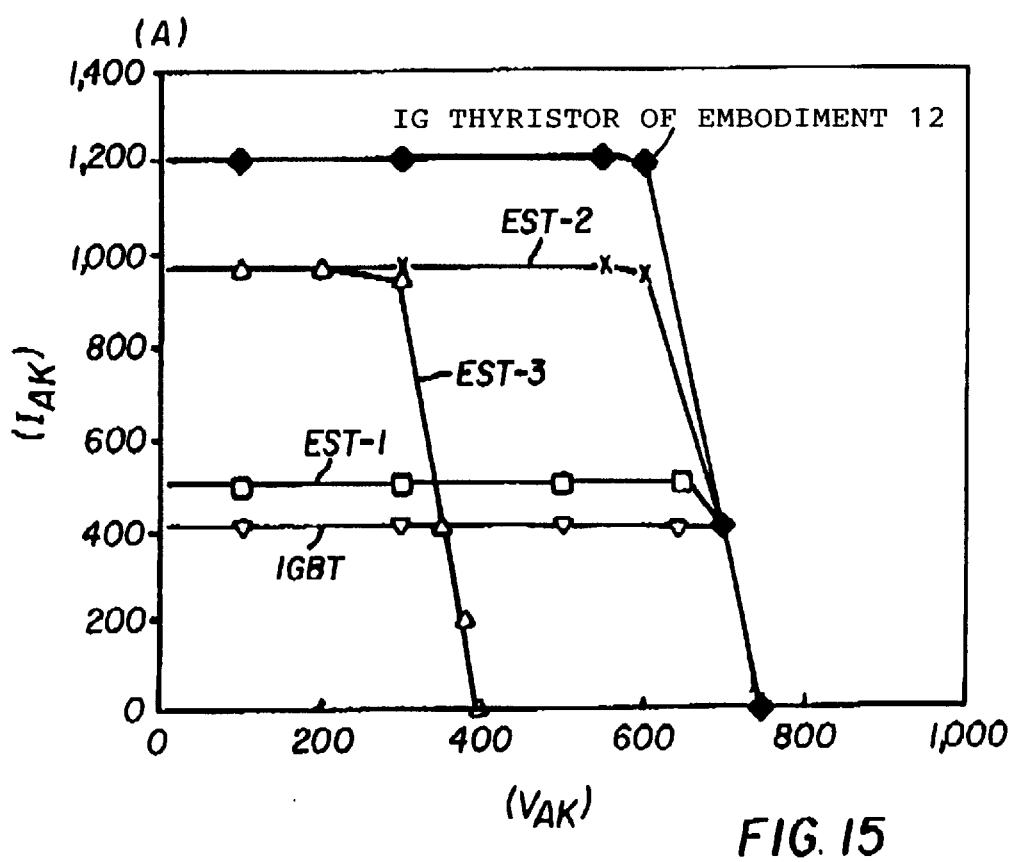
Figure 16:
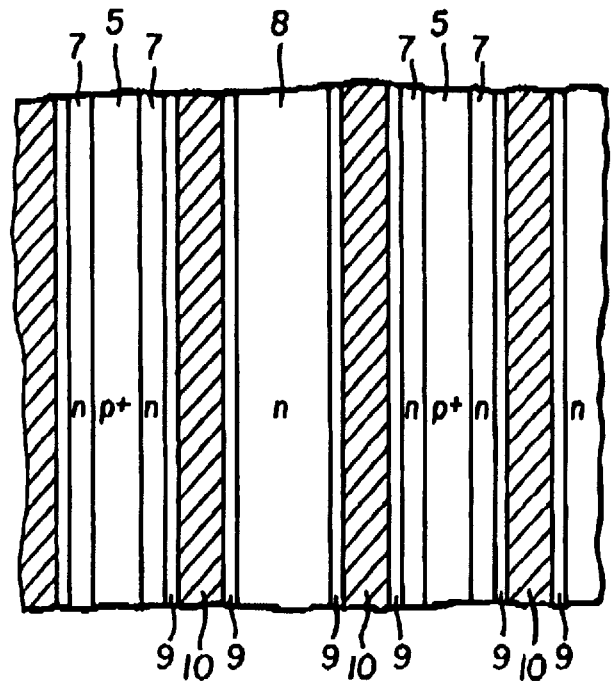
Figure 17:
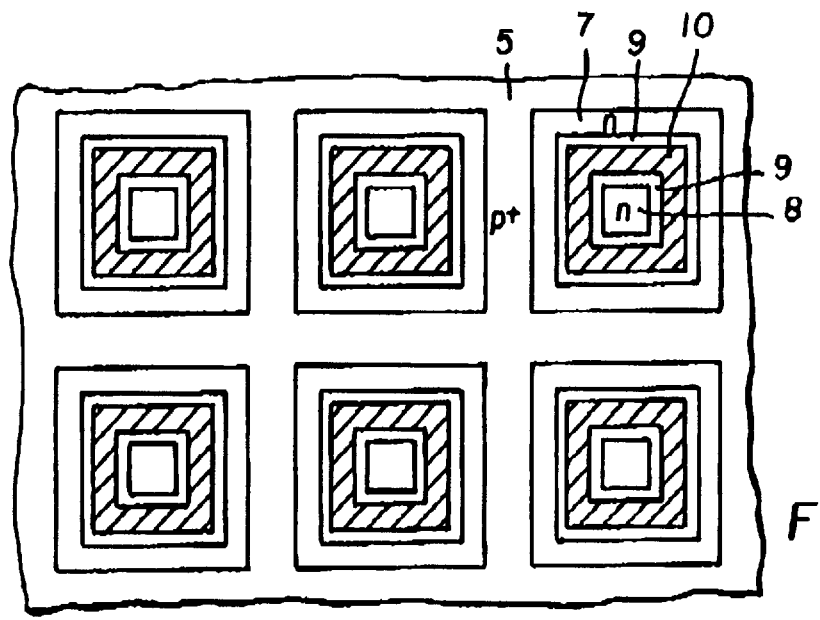
Figure 18:
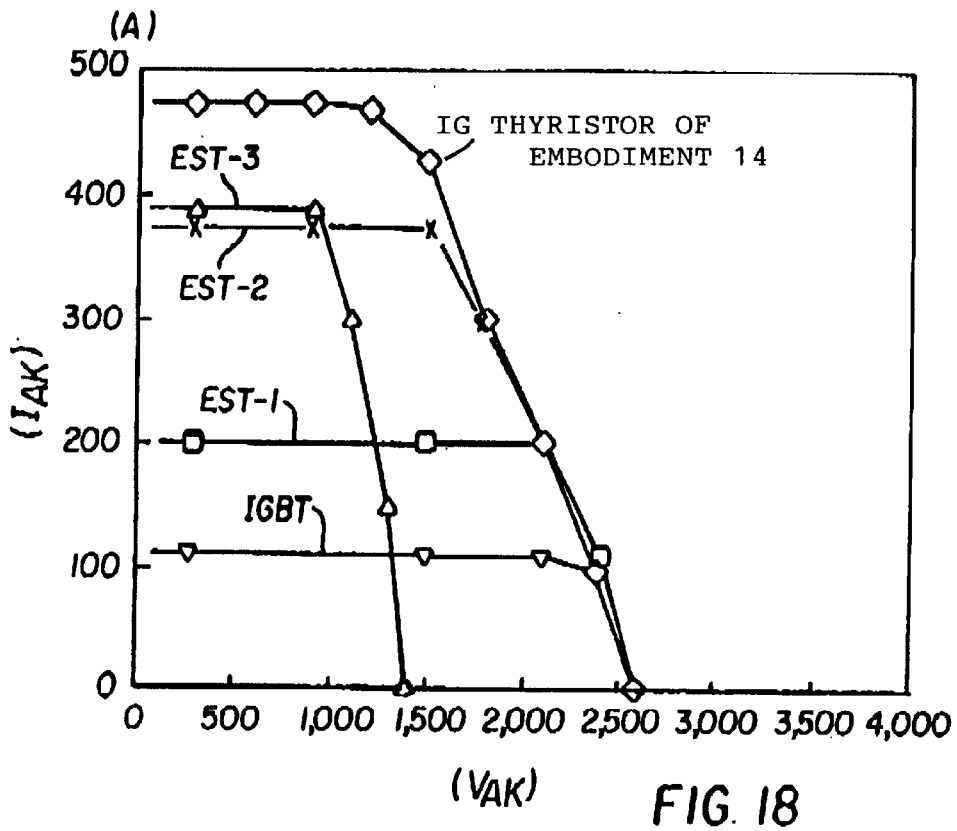
Figure 19:
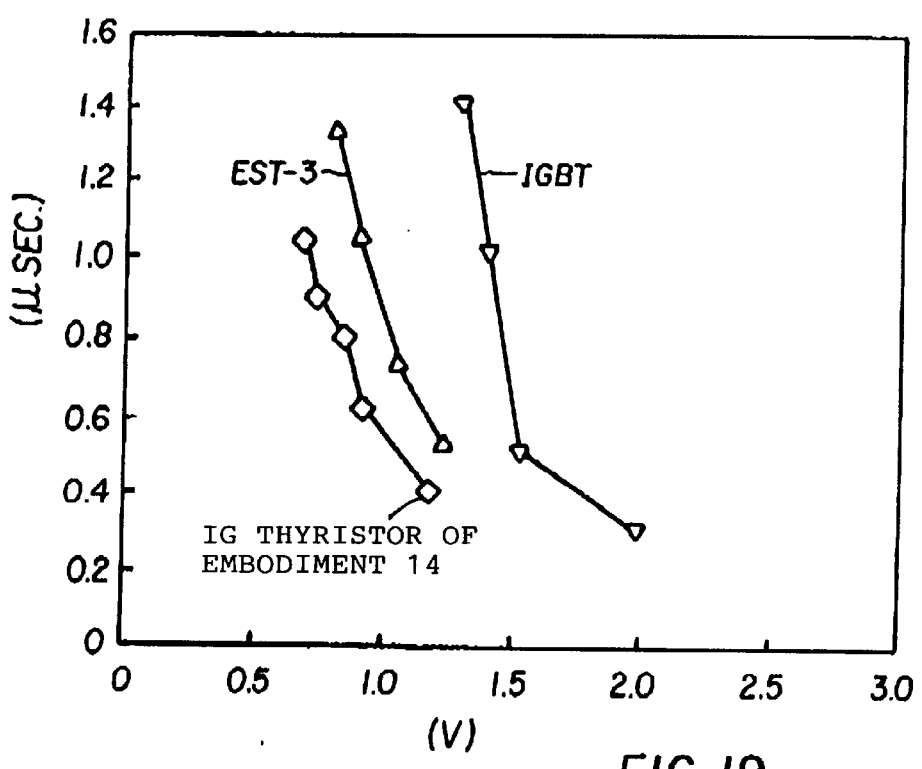
Figure 20:
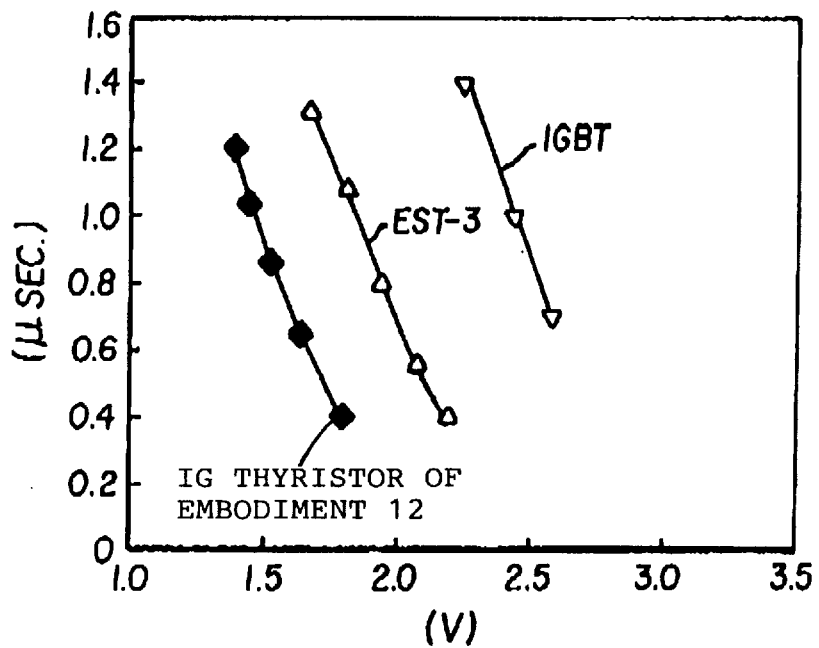
Figure 21:
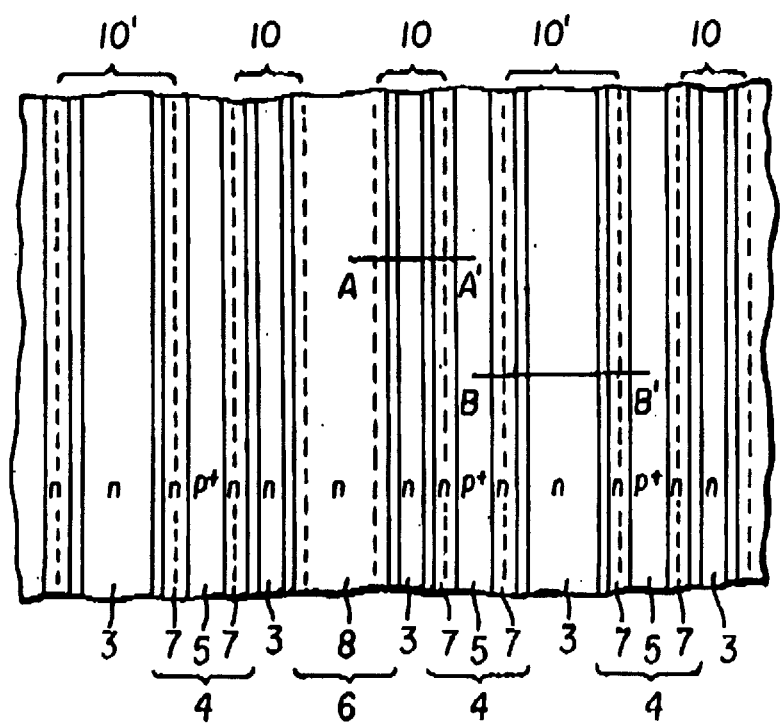
Figure 22:
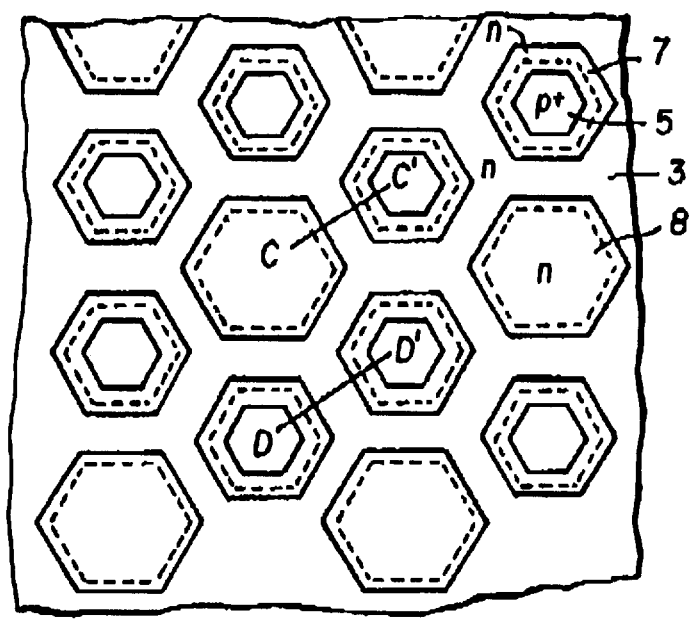
Figure 24:
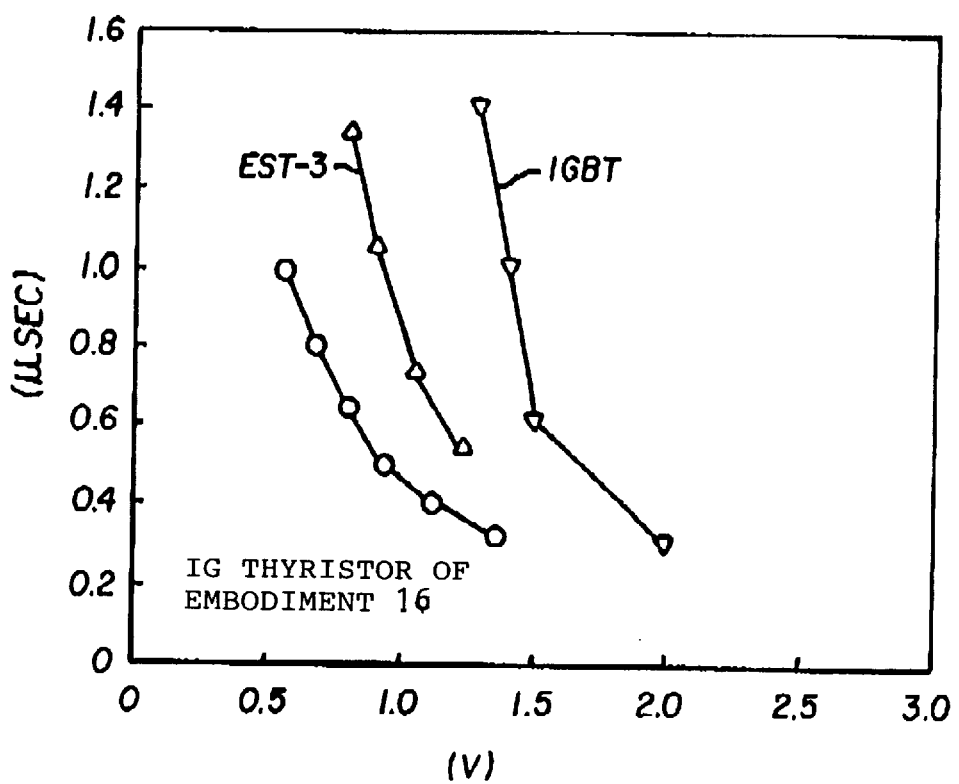
Figure 25:
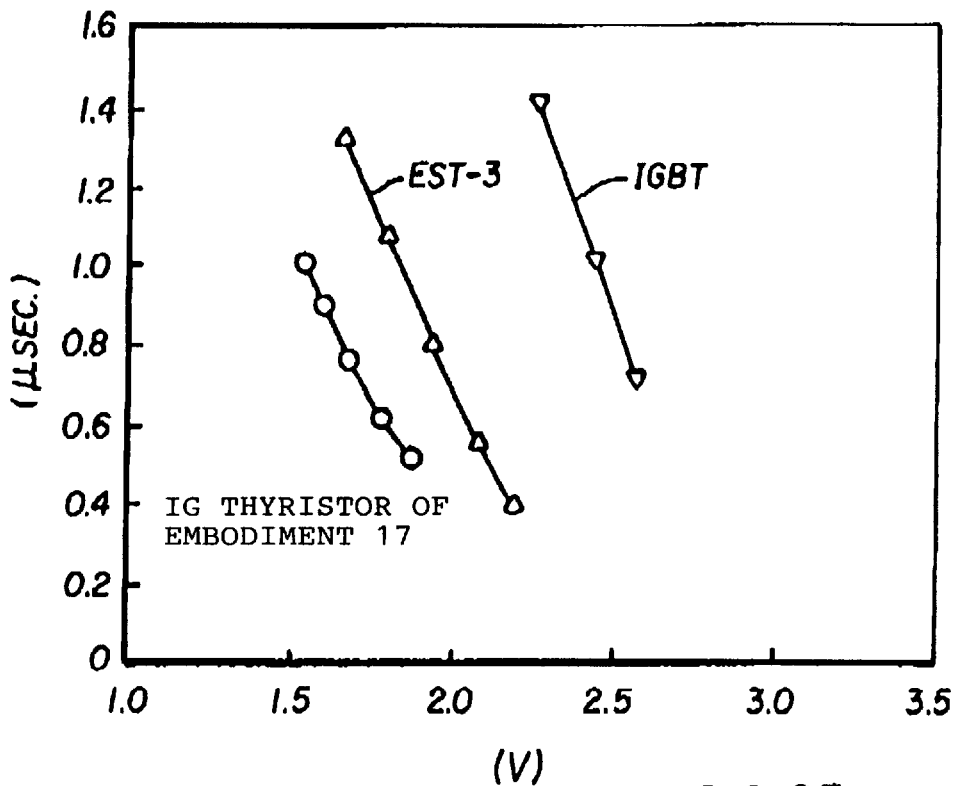
Figure 26:
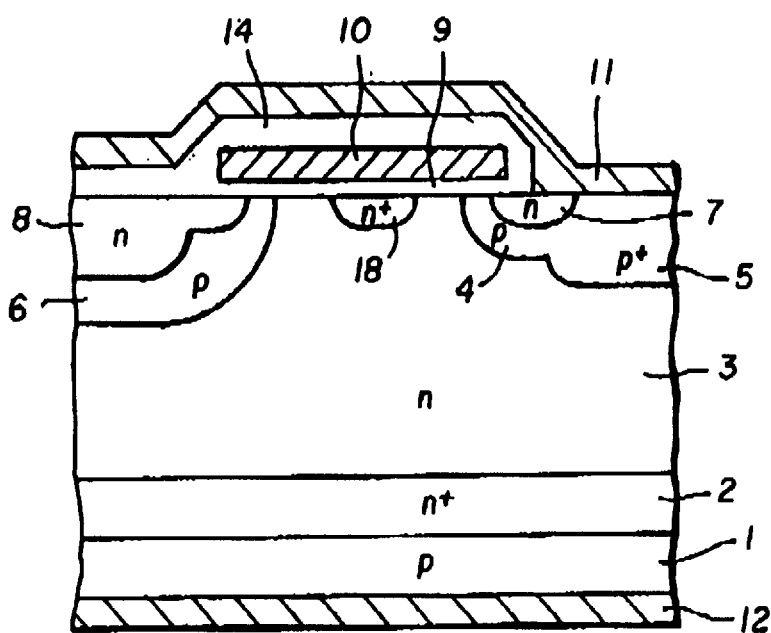
Figure 27:
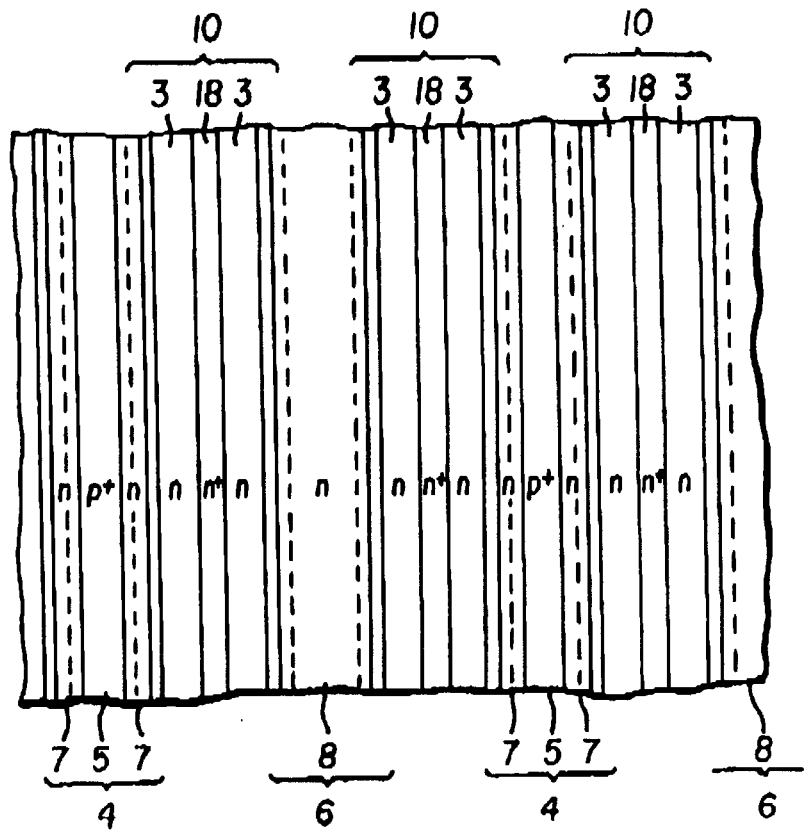
Figure 28:
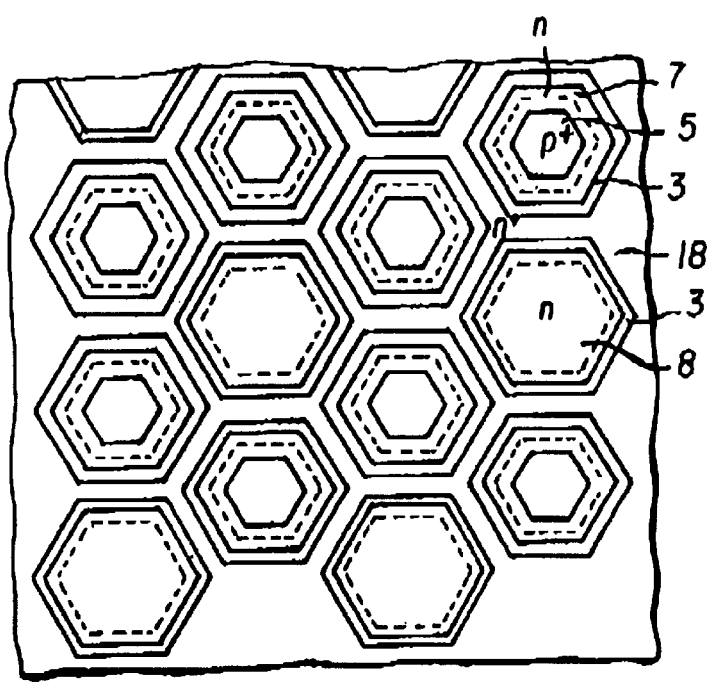
Figure 29:
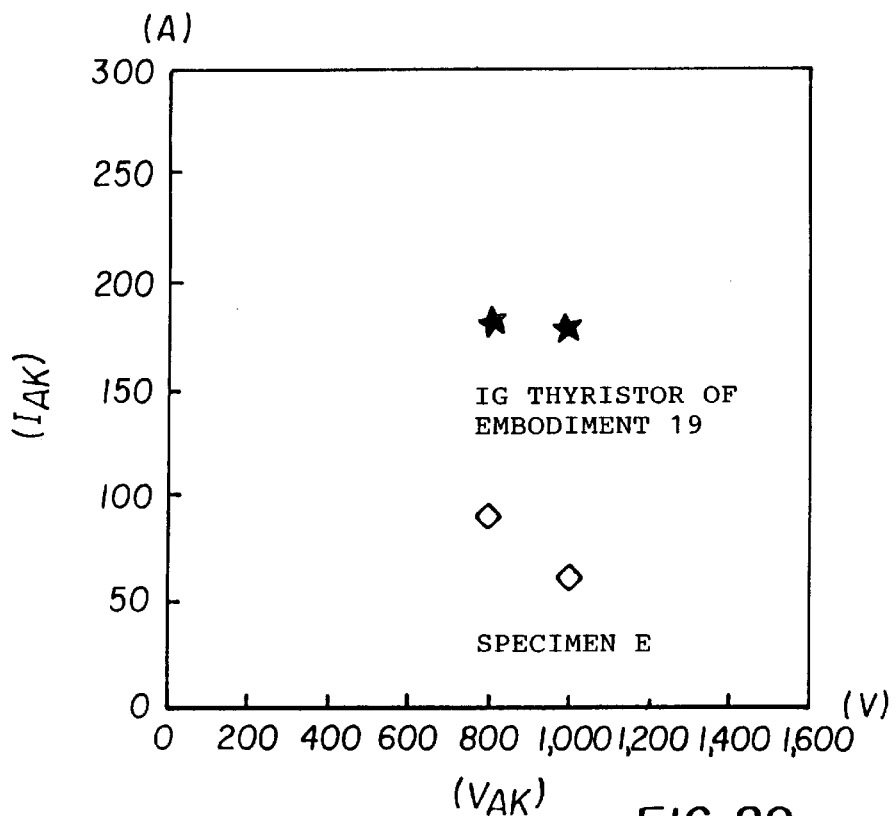
Figure 30:
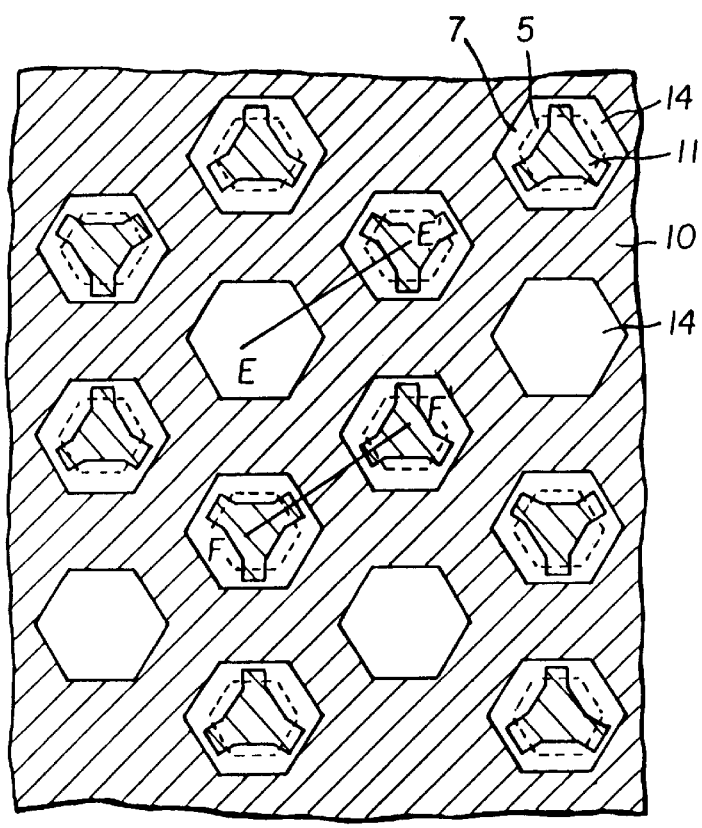
Figure 31:
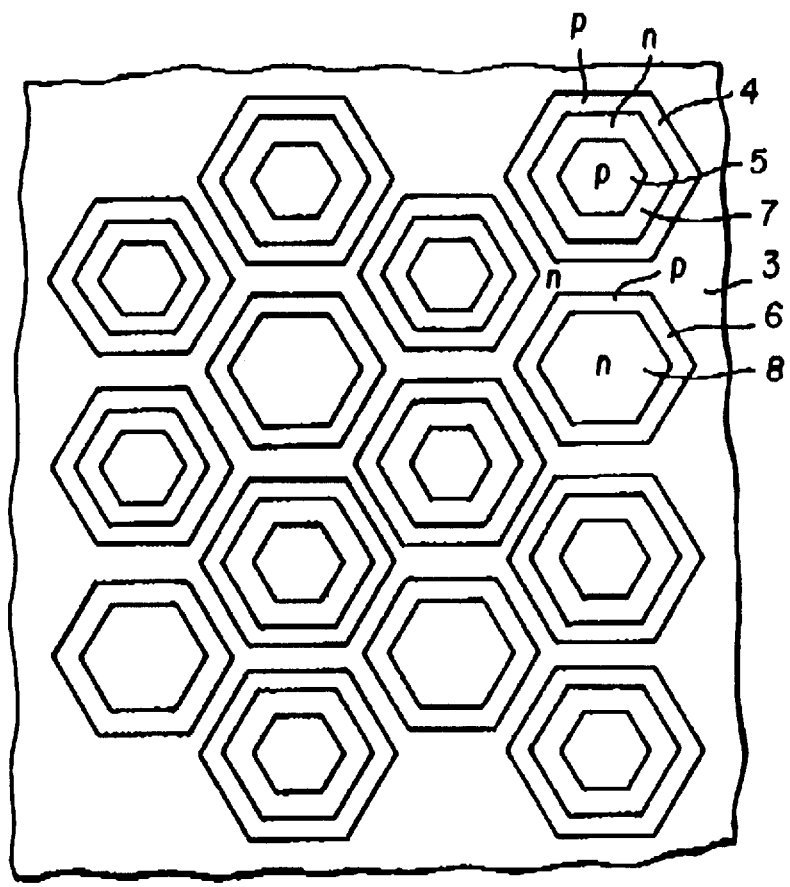
Figure 33:
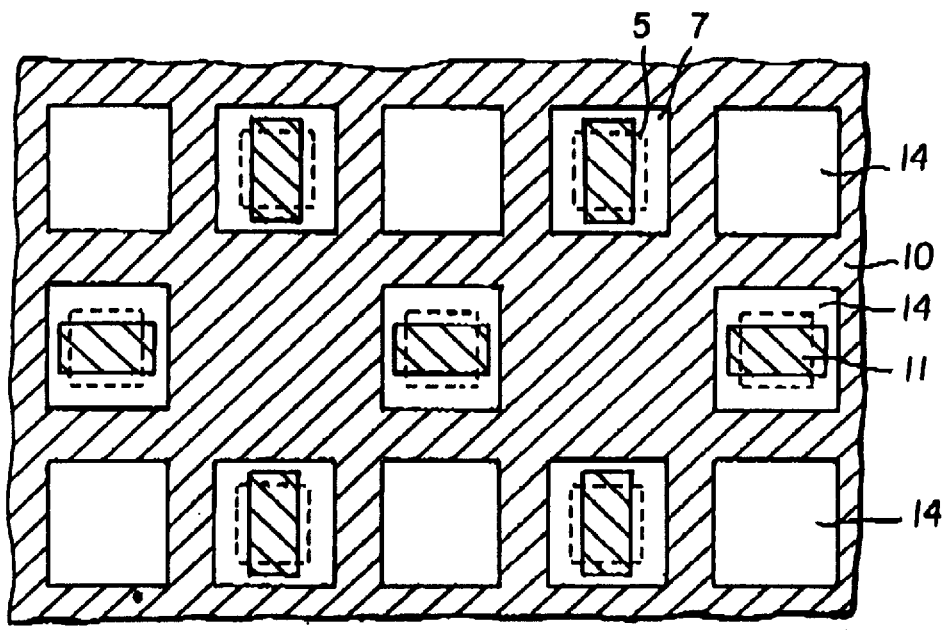
Figure 34:
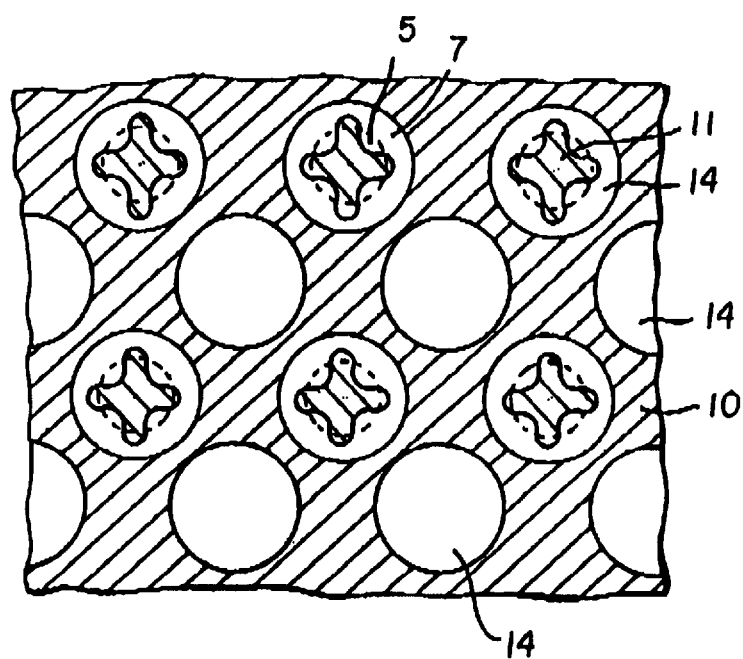
Figure 35:
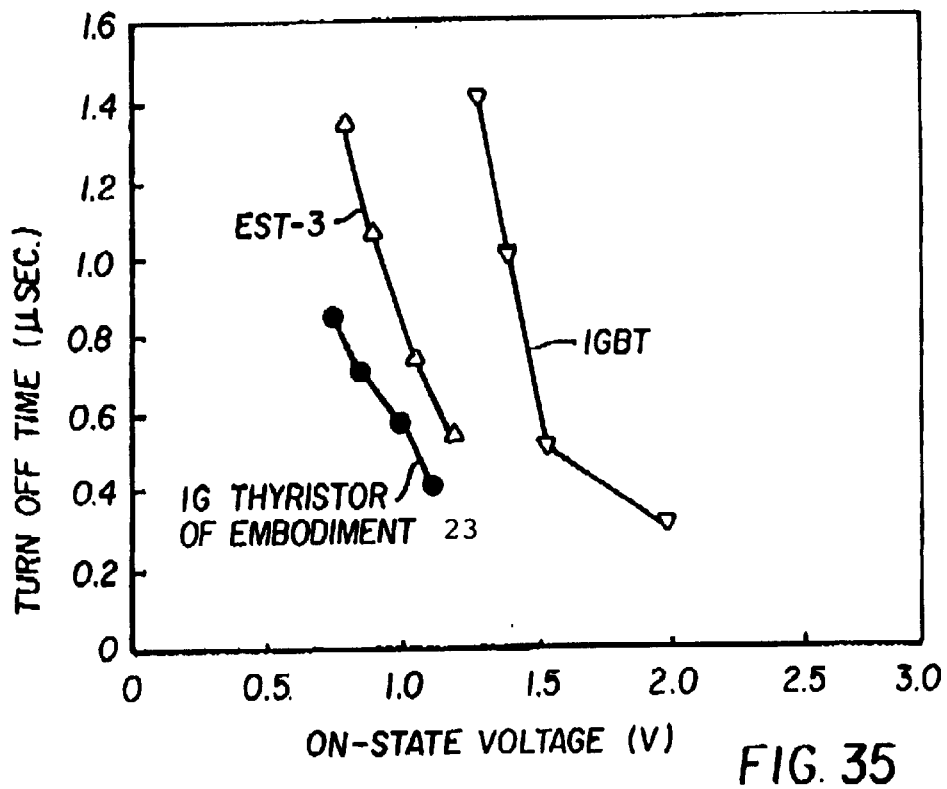
Figure 36:
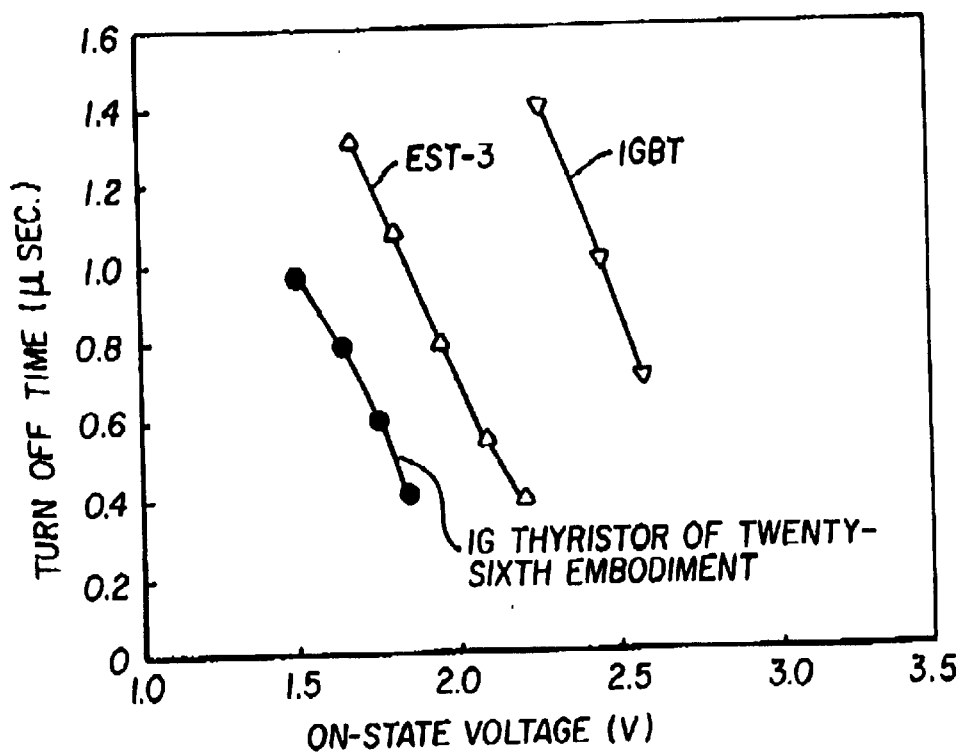
Figure 37:
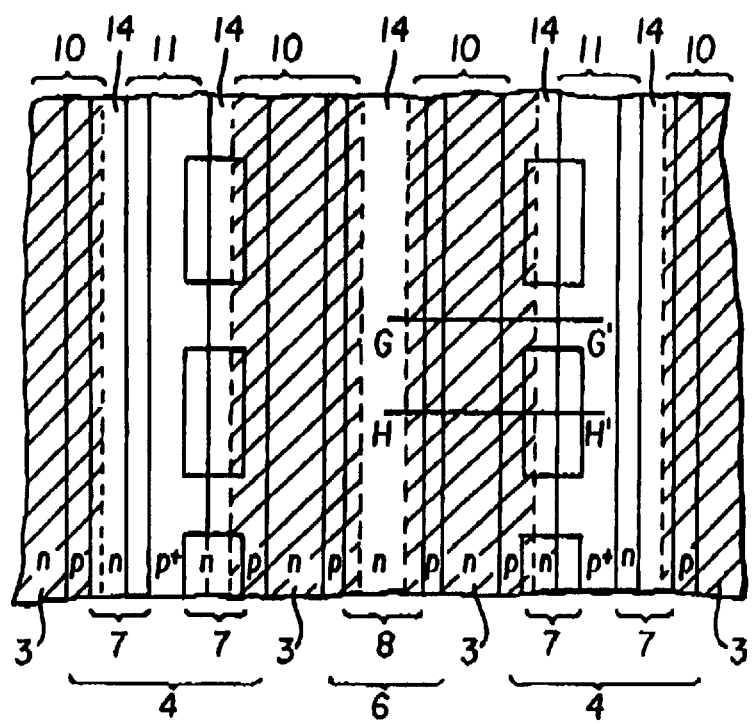
Figure 39:
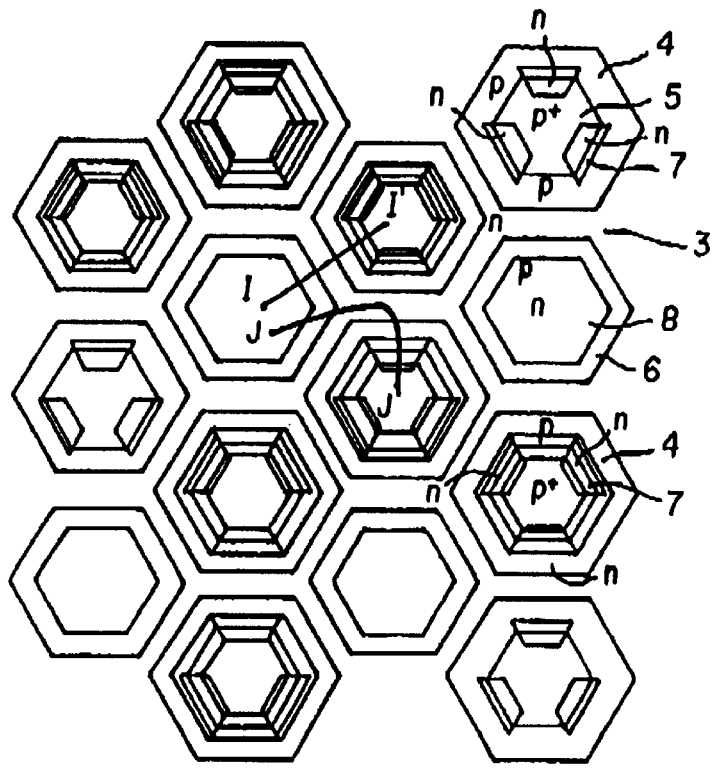
Figure 40:
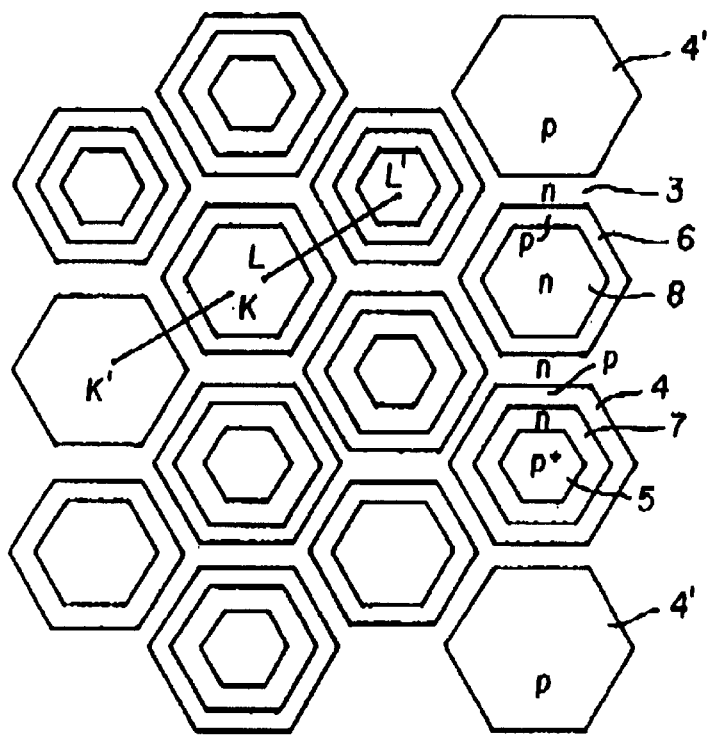
Figure 41:
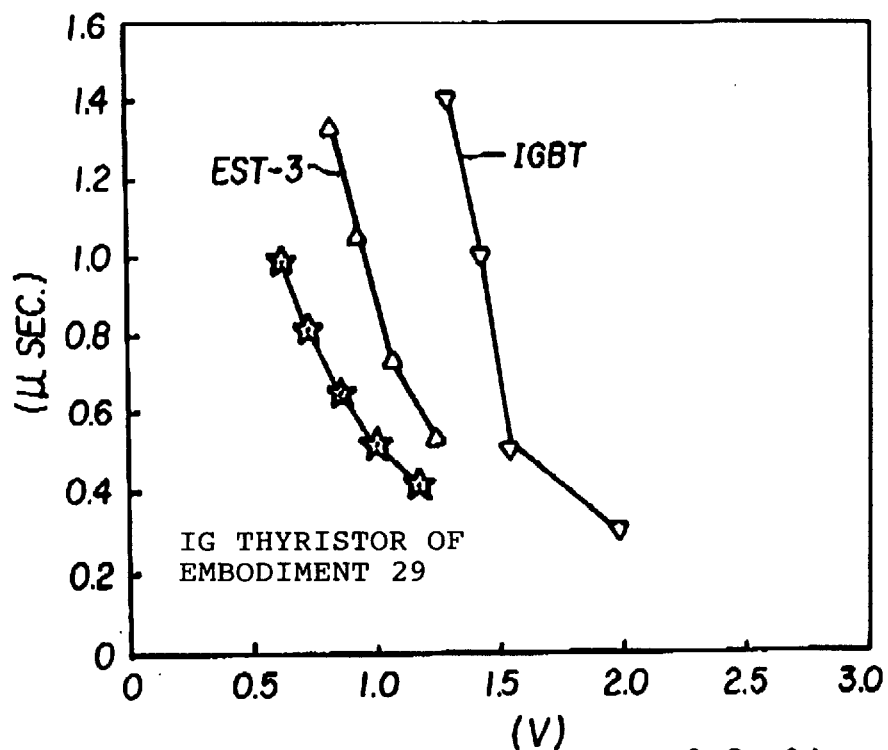
Figure 42:
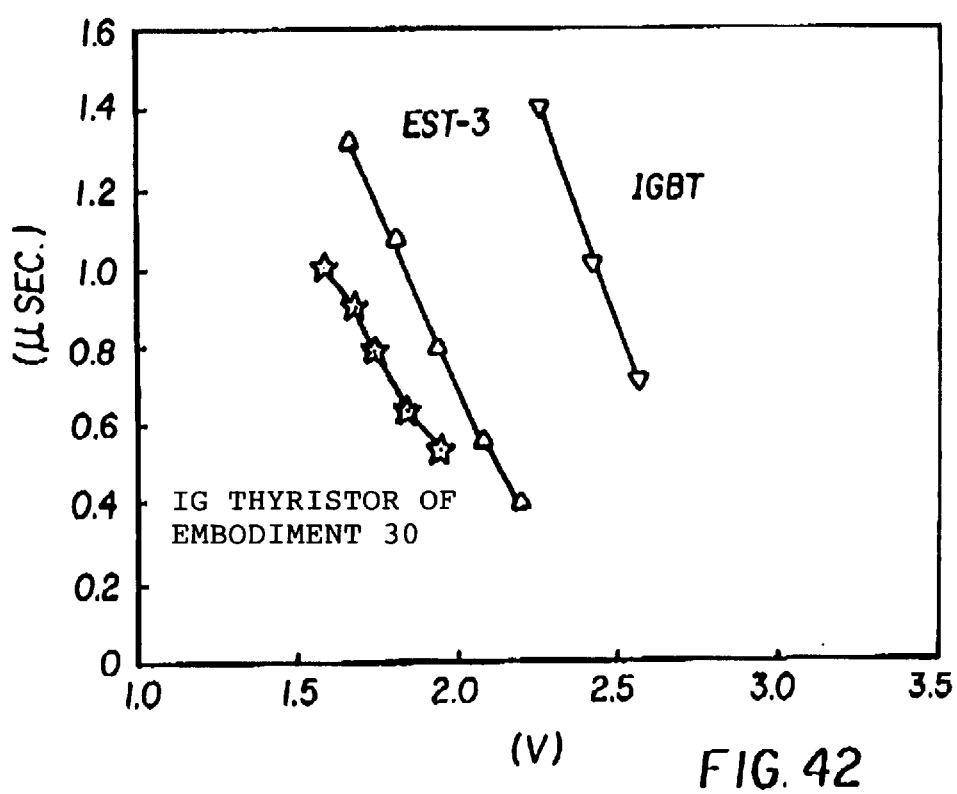
Figure 43:
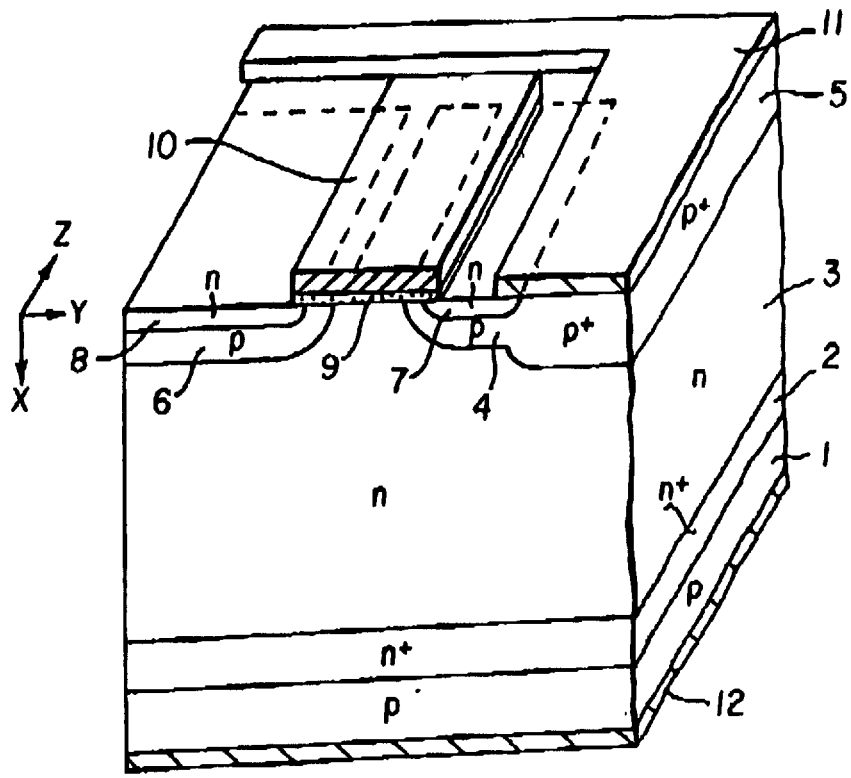
Figure 44:
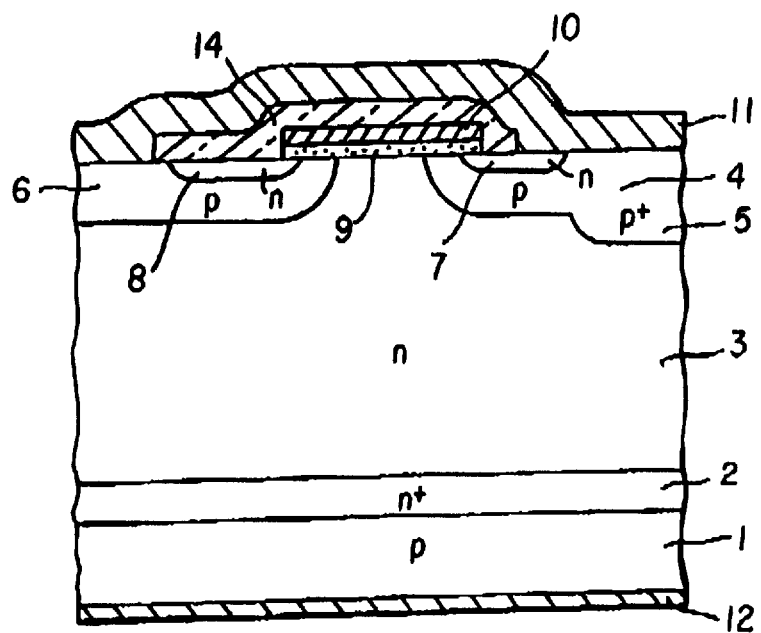

V-class devices of the first and eighth embodiments and comparative examples;

FIG. 13 is a graph showing trade-off characteristics between the ON-state voltage and the turn-off time of 2500 V-class devices of the seventh and tenth embodiments and comparative examples;

FIG. 14 is a fragmentary cross sectional view of an insulated gate thyristor of the twelfth embodiment of the present invention;

FIG. 15 is a graph showing the RBSOAs of 600 V-class devices of the twelfth embodiment and comparative examples;

FIG. 16 is a fragmentary plan view showing a surface of a silicon substrate of the insulated gate thyristor of FIG. 14;

FIG. 17 is a fragmentary plan view showing a surface of a silicon substrate of an insulated gate thyristor of the thirteenth embodiment of the present invention;

FIG. 18 is a graph showing the RBSOAs of 600 V-class devices of the fourteenth embodiment and comparative examples;

FIG. 19 is a graph showing trade-off characteristics between the ON-state voltage and turn-off time of 600 V-class devices of the twelfth embodiment and comparative examples;

FIG. 20 is a graph showing trade-off characteristics between the ON-state voltage and turn-off time of 2500 V-class devices of the fourteenth embodiment and comparative examples;

FIG. 21 is a fragmentary plan view showing a surface of a silicon substrate of an insulated gate thyristor as the fifteenth embodiment of the present invention;

FIG. 22 is a fragmentary plan view showing a surface of a silicon substrate of an insulated gate thyristor as the sixteenth embodiment of the present invention;

FIG. 23($a$) and FIG. 23($b$) are fragmentary cross sectional views of the insulated gate thyristor of the fourteenth embodiment of the invention;

FIG. 24 is a graph showing trade-off characteristics between the ON-state voltage and turn-off time of 600 V-class devices of the sixteenth embodiment and comparative examples;

FIG. 25 is a graph showing trade-off characteristics between the ON-state voltage and turn-off time of 2500 V-class devices of the seventeenth embodiment and comparative examples;

FIG. 26 is a fragmentary cross sectional view of an insulated gate thyristor of the eighteenth embodiment of the present invention;

FIG. 27 is a fragmentary plan view showing a surface of a silicon substrate of the insulated gate thyristor of FIG. 26;

FIG. 28 is a fragmentary plan view showing a surface of a silicon surface of an insulated gate thyristor of the nineteenth embodiment of the present invention;

FIG. 29 is a graph showing the controllable current of the insulated gate thyristor of FIG. 28;

FIG. 30 is a cross sectional view taken across a horizontal plane extending through the middle of a gate electrode of an insulated gate thyristor of the twenty-third embodiment of the present invention;

FIG. 31 is a plan view showing a surface of a silicon substrate of the insulated gate thyristor of FIG. 30, from which the insulating film and electrode are removed;

FIG. 32($a$) is a cross sectional view taken along line E–E' of the insulated gate thyristor of FIG. 30, and FIG. 32($b$) is a cross sectional view taken along line F–F' of the insulated gate thyristor of FIG. 30;

FIG. 33 is a cross sectional view taken across a horizontal plane extending through a gate electrode of an insulated gate thyristor of the twenty-fourth embodiment of the invention;

FIG. 34 is a cross sectional view taken across a horizontal plane extending through a gate electrode of an insulated gate thyristor of the twenty-fifth embodiment of the invention;

FIG. 35 is a graph showing trade-off characteristics between the ON-state voltage and turn-off time of 600 V-class devices of the twenty-third embodiment and comparative examples;

FIG. 36 is a graph showing trade-off characteristics between the ON-state voltage and turn-off time of 2500 V-class devices of the twenty-sixth embodiment and comparative examples;

FIG. 37 is a cross sectional view taken across a horizontal plane extending through the middle of gate electrodes of an insulated gate thyristor as the twenty-seventh embodiment of the present invention;

FIG. 38($a$) is a cross sectional view taken along line G–G' of the insulated gate thyristor of FIG. 37, and FIG. 38($b$) is a cross sectional view taken along line H–H' of the same thyristor;

FIG. 39 is a cross sectional view taken across a horizontal plane extending through the middle of gate electrodes of an insulated gate thyristor as the twenty-eighth embodiment of the invention;

FIG. 40 is a cross sectional view taken across a horizontal plane extending through the middle of gate electrodes of an insulated gate thyristor as the twenty-ninth embodiment of the invention;

FIG. 41 is a graph showing trade-off characteristics between the ON-state voltage and turn-off time of 600 V-class devices of the twenty-ninth embodiment and comparative examples;

FIG. 42 is a graph showing trade-off characteristics between the ON-state voltage and turn-off time of 2500 V-class devices of the thirtieth embodiment and comparative examples;

FIG. 43 is a perspective view in cross section, showing an EST (Emitter Switched Thyristor);

FIG. 44 is a fragmentary cross sectional view showing an improved EST; and

Figure 45:
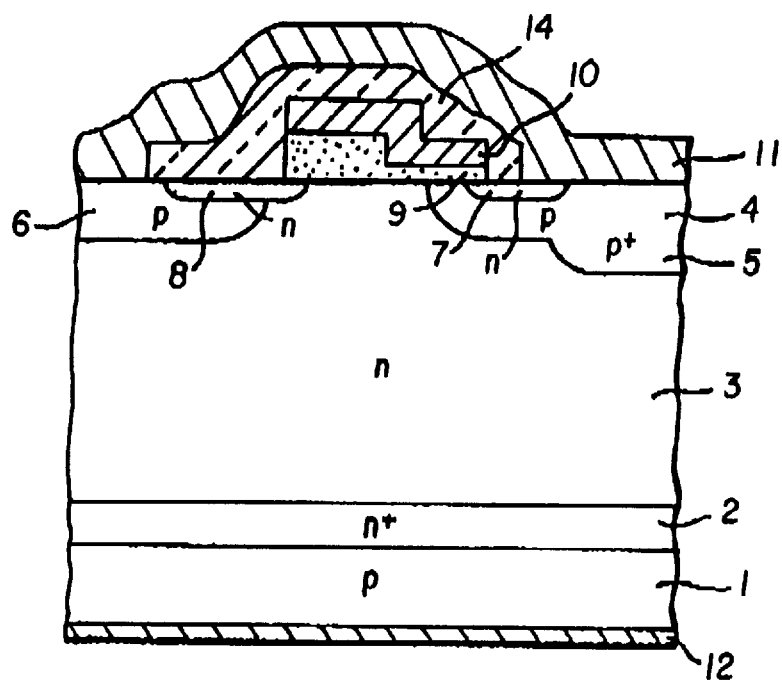

FIG. 45 is a fragmentary cross sectional view showing another improved EST.

DETAILED DESCRIPTION OF THE PREFERRED EMBODIMENTS

In the process of developing the conventional EST to make prototypes of various insulated gate thyristors, in an attempt to solve the above-described problems, the inventors of the present invention found that there is no need to contact the first main electrode with the second second-conductivity-type base region, and that the device can be shifted to the thyristor mode, assuring a good trade-off characteristic between the ON-state voltage and the turn-off time, even if the second second-conductivity-type base region and the first-conductivity-type emitter region in its surface layer are covered with the insulating film. The inventors also added a further analysis to plane patterns of the device.

In the insulated gate thyristor constructed according to the present invention, therefore, the second secondconductivity-type base region and the first-conductivity-type emitter region in its surface layer are covered with the insulating film.

The first and second second-conductivity-type base regions may be in the form of stripes that extend in parallel with each other, or may have a polygonal, circular or elliptical shape. If the first second-conductivity-type base region is disposed so as to surround the second second-conductivity type base region, the current concentration can be avoided, with a result of an improved trade-off characteristic. A plurality of first second-conductivity-type base regions may be advantageously formed around the second second-conductivity-type base region. It is also possible to embed the gate electrode in a trench to provide a trench gate type thyristor.

The current concentration can also be prevented by other methods, including: varying the width of the gate electrode from portion to portion; forming a high-impurity-concentration region in a selected surface area of the first conductivity-type base layer; disconnecting the first-conductivity-type source region below an edge of the gate electrode; covering a surface of the first-conductivity-type source region that is close to the second second-conductivity-type base region, with the insulating film; and providing first second-conductivity-type base regions having no first-conductivity-type source regions.

The first and second second-conductivity-type base regions may have different diffusion depths, and the first-conductivity-type source region and first-conductivity-type emitter region may have different diffusion depths, so as to reduce the ON-state voltage. It was found also effective to localize lifetime killers.

There will be hereinafter described some embodiments of the present invention, referring to the drawings in which the same reference numerals as used in FIG. 43 are used to identify structurally and/or functionally corresponding elements. In the following description, "n" or "p" prefixed to a region or layer means that the relevant region or layer has electrons or holes as majority carriers, respectively. While the first conductivity type is n type and the second conductivity type is p type in the following embodiments, the first and second conductivity types may be p type and n type, respectively.

First Embodiment

Figure 1:
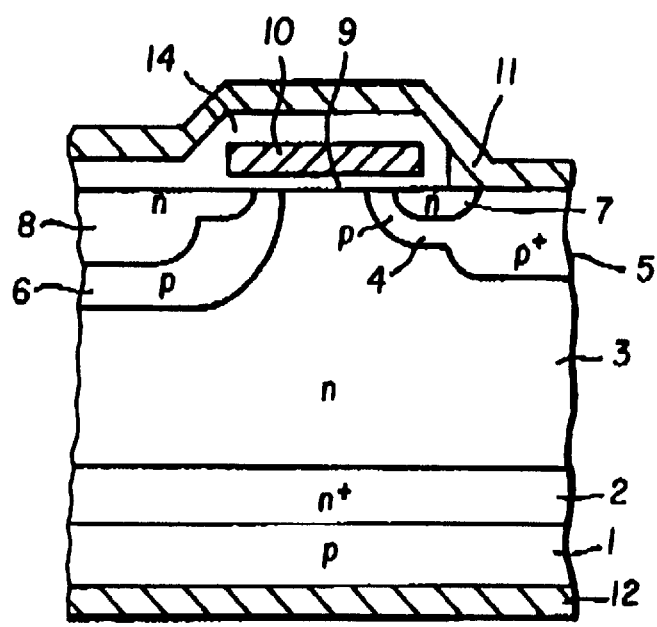
FIG. 1 is a fragmentary cross sectional view of an insulated gate thyristor of the first embodiment of the present invention.

FIG. 1 is a perspective view in cross section, showing an insulated gate thyristor as the first embodiment of the present invention. This figure only shows an active region of one unit of the thyristor assigned to perform switching of electric current. In the actual semiconductor device, each unit further includes a peripheral portion that contributes to withstanding voltage, as well as the active region as shown in the figure. The peripheral portion is not related to the principle of the present invention, and therefore will not be described in detail nor shown in the figure. This applies to the following embodiments, too.

The insulated gate thyristor of FIG. 1 has a semiconductor substrate portion which is similar in construction to that of the EST of FIG. 43. Specifically, a first p base region 4 and a second p base region 6 are formed in a surface layer of an n base layer 3 having a relatively high resistivity, such that these base regions 4, 6 are spaced apart from each other. Further, a $p^+$ well region 5 having a greater diffusion depth than the first p base region 4 is formed in a part of the first p base region 4 so as to avoid latch-up of a parasitic thyristor. A p emitter layer 1 is formed on the other surface of the n base layer 3, through an $n^+$ buffer layer 2 having a higher impurity concentration than the n base layer 3. An n source region 7 is formed in a surface layer of the first p base region 4, and an n emitter region 8 is formed in a surface layer of the second p base region 6. In particular, the n emitter region 8 has two-stage diffusion depth, that is, a portion of the n emitter region 8 that is close to the n source region 7 has substantially the same depth as the n source region 7, and a portion of the n emitter region 8 remote from the n source region 7 has a greater depth than the n source region 7. As in the thyristor of FIG. 43, a gate electrode 10 is formed through a gate oxide film 9 over the first p base region 4, n base layer 3 and second p base region 6, which are interposed between the n source region 7 and the n emitter region 8, to thereby provide an n-channel lateral MOSFET. A surface of the MOSFET on the side of the gate electrode 10 is covered with an insulating film 14 made of phosphorus glass (PSG), and a contact hole is formed through the insulating film 14 so that a cathode 11 contacts both of the surfaces of the first p base region 4 and the n source region 7.

The insulated gate thyristor of FIG. 1 can be produced in substantially the same procedure in which the conventional IGBT is produced, using different masks for forming diffusion regions. To produce a 600 V-class device, for example, a 10 μm-thickness n layer having a resistivity of 0.1 Ω.cm as the $n^+$ buffer layer 2, and a 55 μm-thickness n layer having a resistivity of 40 .cm as the n base layer 3 are epitaxially grown on a 450 μm-thickness p type silicon substrate having a resistivity of 0.02 Ωm, so as to provide a wafer. The first and second p base regions 4, 6 and p emitter layer 1 are formed by implantation of boron ions and thermal diffusion, and the n emitter region 8 and n source region 7 are formed by implantation of arsenic ions and phosphorus ions and thermal diffusion. The ends of the first p base region 4, second p base region 6, n source region 7 and n emitter region 8 are positioned by the gate electrode or the like formed of polycrystalline silicon on the semiconductor substrate, and spacings between these regions 4, 6, 7 and 8 are determined by diffusion of the respective regions in the lateral direction. The cathode 11 is made of an Al alloy and formed by sputtering, and the anode 12, which is to be soldered to a metallic substrate, consists of three layers of Ti, Ni and Au, and formed in lamination by sputtering. The lifetime of carriers is controlled by electron beam irradiation, so as to reduce the switching time. The diffusion depths of the first p base region 4 and the second p base region 6 are 3 μm and 18 μm, respectively, and the diffusion depths of the n emitter region 8 and the n source region 7 are 10 μm and 0.4 μm, respectively. The width of the gate electrode is 25 μm, and the width of the n source region 7 is 4 μm. The cell pitch is 55 μm. With the diffusion depth of the second p base region 6 made larger than that of the first p base region 4, and the diffusion depth of the n emitter region 8 made larger than that of the n source region 7, a pnp transistor of a thyristor portion of the insulate gate thyristor has an increased current amplification factor, resulting in reduced ON-state voltage. The portion of the n emitter region 8 close to the first p base region 4 has substantially the same depth as the n source region 7, with the withstand voltage taken into consideration.

Figure 2:
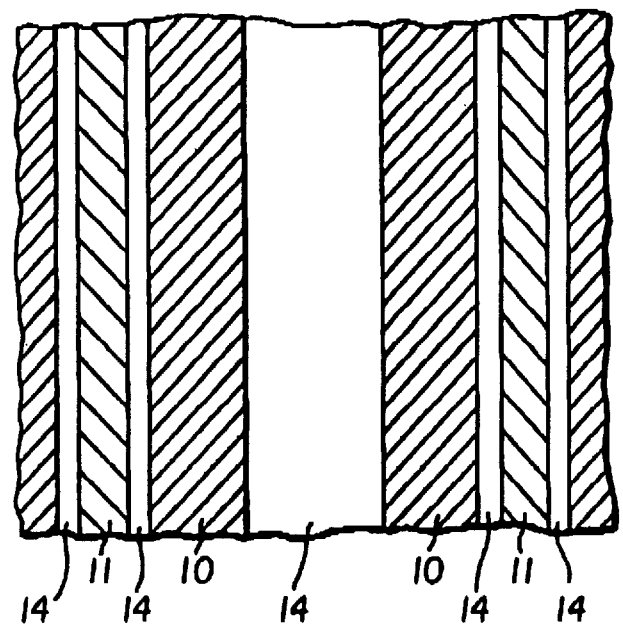
FIG. 2 is a cross sectional view taken across a horizontal plane extending through the middle of gate electrodes of the insulated gate thyristor of FIG. 1.

FIG. 2 is a cross sectional view taken across a horizontal plane extending through the middle of gate electrodes 10 of a plurality of cells (each of which is shown in FIG. 1) constituting the MOSFET. In FIG. 2, the same reference numerals as used in FIG. 1 are used to identify corresponding elements. As shown in the figure, the cathode 11, gate electrode 10, and insulating film 14 that separate these elements 11, 10 from each other are all arranged in the form of parallel stripes. The cathode 11, which is in the shape of stripes in the cross sectional view of FIG. 2, actually extends over the gate electrode 10 through the insulating film 14, as seen in the cross sectional view of FIG. 1.

There will be next described an operation of the insulated gate thyristor constructed as described above. When the cathode 11 is grounded, and positive voltage is applied to the gate electrode 10 while the anode 12 is biased positive, an inversion layer (partial accumulation layer) is formed under the gate oxide film 9, and the lateral MOSFET is thus turned on. As a result, electrons are initially fed from the cathode 11 to the n base layer 3, through the n source region 7, and a channel of the MOSFET formed in a surface layer of the first p base region 4. These electrons function as a base current for a pnp transistor, which consists of the p emitter layer 1, the $n^+$ buffer layer 2 and n base layer 3, and the p base region 4 ($p^+$ well region 5). Thus, the pnp transistor operates in the IGBT mode with this base current.

With the pnp transistor thus operated, holes are injected from the p emitter layer 1, and flow toward the first p base region 4, through the $n^+$ buffer layer 2 and the n base layer 3. At the same time, the potential of the second p base region 6, which is in a floating state, is gradually increased due to the hole current flowing through the n base layer 3. Since the n emitter region 8 is kept at the potential of the cathode 11 through the channels of the MOSFET, electrons begin to be injected from the n emitter region 8 to the second p base region 6 after a while, whereby a thyristor portion consisting of the p emitter layer 1, $n^+$ buffer layer 2 and n base layer 3, second p base region 6 and the n emitter region 8 starts operating in a thyristor mode.

Upon turn-off, the potential of the gate electrode 10 is lowered below the threshold of the lateral MOSFET, to turn off this MOSFET, so that the n emitter region 8 is electrically cut off from the cathode 11, and the thyristor stops operating.

The insulated gate thyristor of FIG. 1 is different from that of FIG. 43 in that both surfaces of the second p base region 6 and n emitter region 8 are covered with the insulating film 14, and the second base region 6 is not in contact with the cathode 11.

When a voltage is applied to the gate electrode 10, therefore, the potential of the n emitter region 8 is made equal to that of the cathode 11, through the channels of the MOSFET. As a result, the potential of the second base region 6 is gradually increased due to the hole current flowing through the n base layer 3, until injection of electrons from the n emitter region 8 takes place, whereby the thyristor consisting of the n emitter region 8, second p base region 6, n base layer 3 and p emitter layer 1 is turned on. In this manner, the IGBT mode is rapidly shifted to the thyristor mode, without requiring the hole current flowing in the Z direction in the second p base region as in the conventional EST. Further, the ON-state voltage is lowered since the electrons are uniformly injected from the entire n emitter region 8. Upon turn-off, the pn junction between the n emitter region 8 and the second p base region 6 can uniformly resume its reverse-blocking ability, due to the potential difference therebetween, whereby current localization or concentration can be avoided, assuring a significantly increased reverse bias safe operation area (RBSOA).

Figure 4:
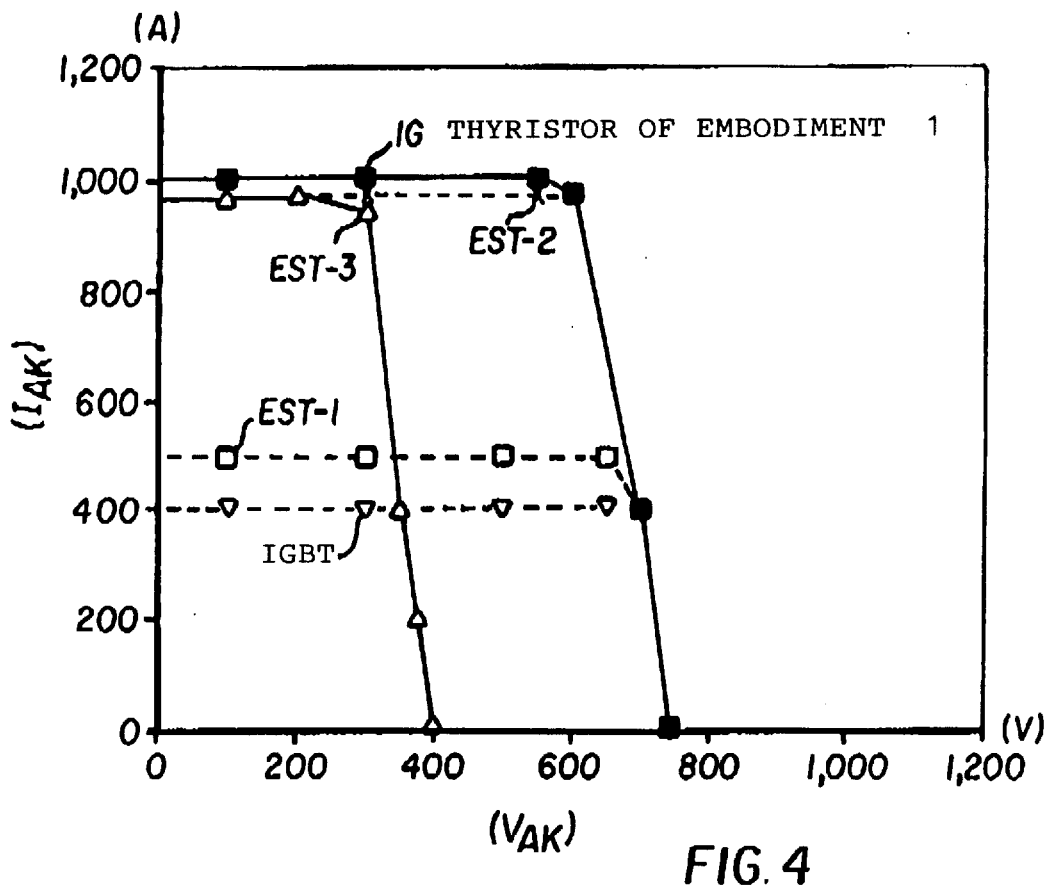
FIG. 4 is a graph showing the RBSOAs of 600 V-class devices of the first embodiment and comparative examples.
Figure 5:
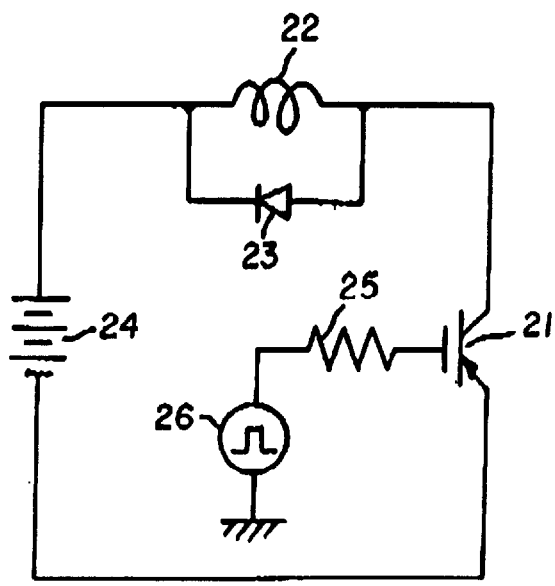
FIG. 5 is a circuit diagram for measuring the RBSOA.

The graph of FIG. 4 shows results of measurements of the reverse bias safe operation areas (RBSOA) of the insulated gate thyristor shown in FIG. 1 as the first embodiment of the present invention, ESTs as comparative examples, including EST-1 as shown in FIG. 43, EST-2 as shown in FIG. 44 and EST-3 as shown in FIG. 45, and an IGBT as another comparative example. The RBSOA was measured at 125° C. with a measuring circuit as shown in FIG. 5. In the graph of FIG. 4, the axis of abscissa indicates voltage ($V^{AK}$) between the anode and the cathode, and the axis of ordinates indicates electric current. In FIG. 5, a device 21 to be measured was connected to a dc power supply 24, through a 1 mH inductor 22 and a free-wheeling diode 23 connected in parallel with the inductor 22, and a gate of the device 21 was connected to a gate power supply 26, through a resistor 25 of 20 Ω.

The devices 21 shown in FIG. 4 were produced as 600 V-class devices, and the devices of the comparative examples were produced using epitaxial wafers having the same specification as that of the insulated gate thyristor of the first embodiment. The n emitter region 8 of both of EST-2 and EST-3 had a width of 20 μm. All of the five devices of FIGS. 1, 43, 44 and 45 and IGBT had a chip size of 1 cm$^2$. The ON-state voltage, as defined by a fall of potential occurring upon conduction of current of 100 A.cm$^-$$_2$, was 0.9 V for the insulated gate thyristor of the present invention, 1.6 V for the EST-1, 1.7 V for the EST-2, 1.0 V for the EST-3, and 2.3 V for the IGBT. It will be understood from FIG. 4 that the device of the first embodiment of the present invention has a safe operation area that is two and a half times as large as that of the IGBT, and twice as large as those of the EST-1 and EST-3, assuring relatively high breakdown withstand capability. Further, the ON-state voltage of the device of the invention is lower than those of the other devices. While the present device exhibits substantially the same degree of breakdown withstand capability as the EST-2, it is still advantageous over the EST-2 because of its lower ON-state voltage. Thus, according to the present invention, the ON-state voltage can be lowered without affecting other characteristics. This is because the reduction of the ON-state voltage is caused by the uniform injection of electrons from the entire n emitter region 8, and the current localization or concentration can be avoided due to the arrangement in which the stripe-shaped second p base region 6 and n emitter region 8 formed in its surface layer are opposed to or face the similarly stripe-shaped first p base region 4 and n source region 7 formed in its surface layer, over the entire length of the stripes.

Second Embodiment

Figure 3:
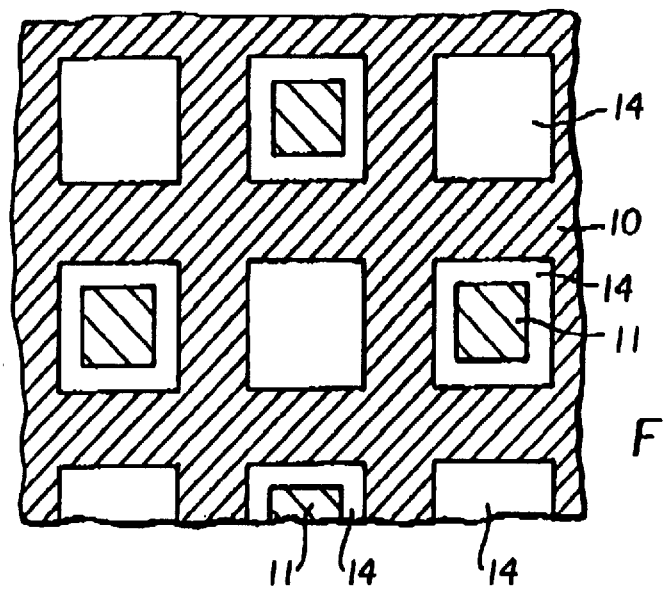
FIG. 3 is a cross sectional view taken across a horizontal plane extending through the middle of a gate electrode of an insulated gate thyristor as the second embodiment of the present invention.

FIG. 3 is a cross sectional view of an insulated gate thyristor according to the second embodiment of the present invention, taken in a plane extending through the middle of the gate electrode 10. In this insulated gate thyristor, the first p base region 4 and the n source region 7 as a part of its surface layer, and the second p base region 6 and the n emitter region 8 as a part of its surface layer are formed through square holes provided in the gate electrode 10. The cathode 11 contacts the surfaces of the first p base region 4 and the n source region 7, through a contact hole formed through the insulating film 14 deposited on one side of the gate electrode 10. The surfaces of the second p base region 6 and the n emitter region 8 formed in its surface layer are covered with the insulating film 14, and are therefore not shown in the figure. In this embodiment, too, the cathode 11 extends over the gate electrode 10 through the insulating film 14.

Third Embodiment

Figure 6:
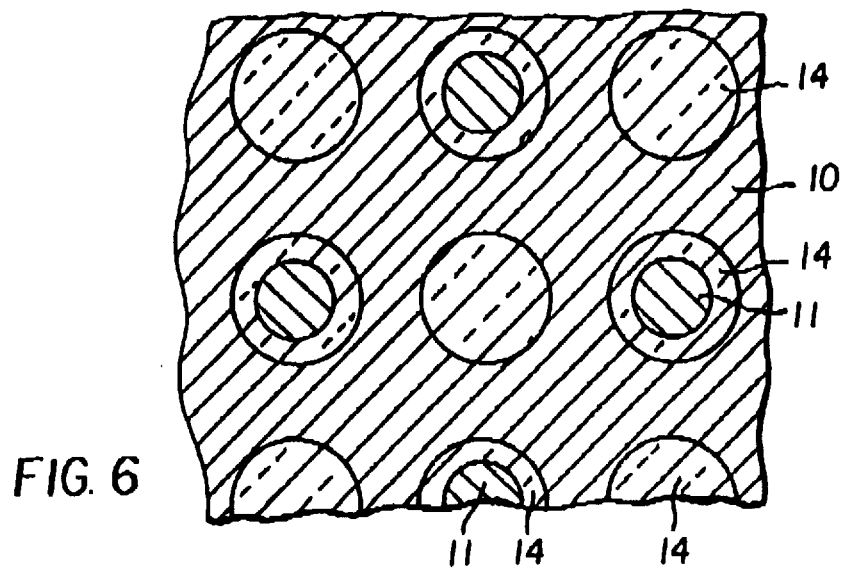
FIG. 6 is a cross sectional view taken across a horizontal plane extending through the middle of a gate electrode of an insulated gate thyristor as the third embodiment of the present invention.

FIG. 6 is a cross sectional view of an insulated gate thyristor according to the third embodiment of the present invention, taken across a plane extending through the middle of the gate electrode 10. In this insulated gate thyristor, the first p base region 4 and the n source region 7 as a part of its surface layer, and the second p base region 6 and the n emitter region 8 as a part of its surface layer are formed through circular holes provided in the gate electrode 10. This embodiment differs from the second embodiment of FIG. 3 only in respect of its pattern or shape of the holes, and the arrangement of the gate electrode 10, cathode 11 and insulating film 14 of this embodiment is the same as that of the second embodiment.

Fourth Embodiment

Figure 7:
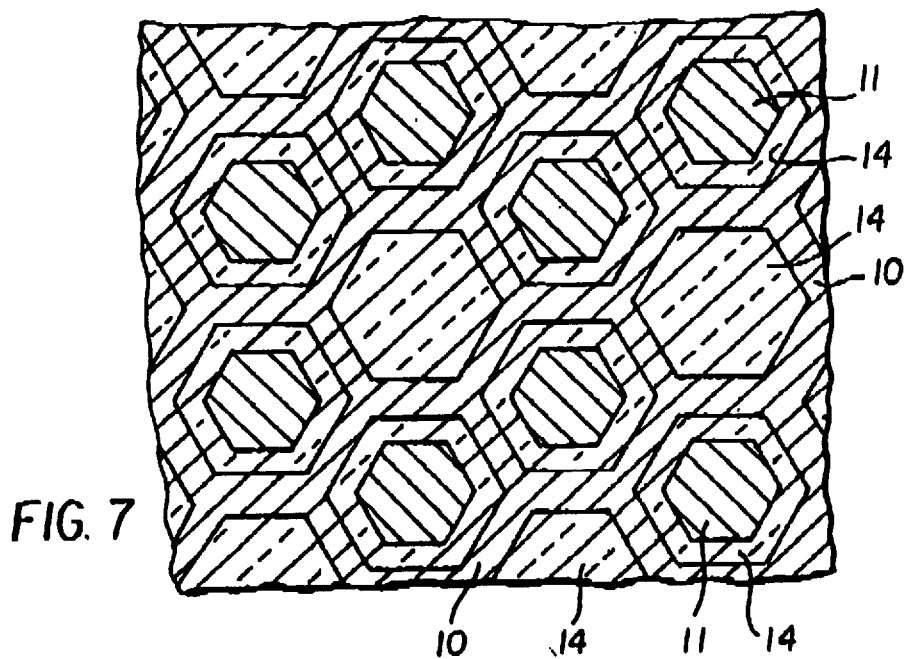
FIG. 7 is a cross sectional view taken across a horizontal plane extending through the middle of a gate electrode of an insulated gate thyristor as the fourth embodiment of the present invention.

FIG. 7 is a cross sectional view of an insulated gate thyristor according to the fourth embodiment of the present invention, taken across a plane extending through the middle of the gate electrode 10. In this insulated gate thyristor, the first p base region 4 and the n source region 7 as a part of its surface layer, and the second p base region 6 and the n emitter region 8 as a part of its surface layer are formed through hexagonal holes provided in the gate electrode 10. This embodiment differs from the second and third embodiments of FIGS. 3 and 6 only in respect of its pattern or shape of the holes, and the arrangement of the gate electrode 10, cathode 11 and insulating film 14 of this embodiment is the same as those of the second and third embodiments.

The ON-state voltage and the RBSOA of each of the insulated gate thyristors of FIGS. 3, 6 and 7 were measured, using the circuit of FIG. 5. As seen in TABLE 1 indicating the results of the measurements, all of these thyristors exhibited relatively low ON-state voltages of around 0.85 V, and large RBSOAs of 1000 A or greater.

As in the insulated gate thyristor of the first embodiment, the devices of FIGS. 3, 6 and 7 provide such low ON-state voltages and large RBSOAs because the pn junction between the n emitter region 8 and the second p base region 6 can uniformly resume its reverse-blocking ability, and the second p base region 6 functions as a bypass of the hole current. Further, in the devices of FIGS. 3, 6 and 7 in which the second p base region 6 is surrounded by a plurality of first p base region 4 and n source regions 7 formed therein, the current emitted from the n emitter region 8 is dispersed, in other words, directed to the surrounding regions 4, 7, thus permitting an increase in the controllable current. Moreover, the accumulation layers are formed under the gate electrode 10, which results in lowered ON-state voltage.

TABLE 1 also indicates results of the same measurements with respect to insulated gate thyristors having cells with octagonal, dodecagonal and elliptical holes formed through the gate electrode 10 for forming the first p base region 4 and the n source region 7 in its surface layer, and the second p base region 6 and the n emitter region 8 in its surface layer. As seen in TABLE 1, all of these thyristors exhibited low ON-state voltages of around 0.84 V, and large RBSOAs of 1000 A or greater. The width of the n source region 7 of each cell was 4 $\mu$m. The ON-state voltage is considered as a level (V) at 100 A.cm$^{-2}$, and the RBSOA is considered as a level (A) when the voltage $V_{AK}$ between the anode and the cathode is 500 V.

TABLE 1

| Cell shape | Square | Hexagon | Octagon | Dodecagon | Circle | Ellipse |
| --- | --- | --- | --- | --- | --- | --- |
| ON-state voltage | 0.85 | 0.84 | 0.84 | 0.84 | 0.85 | 0.88 |
| RBSOA | 1010 | 1001 | 1015 | 1015 | 1018 | 1000 |

Fifth Embodiment

Figure 8:
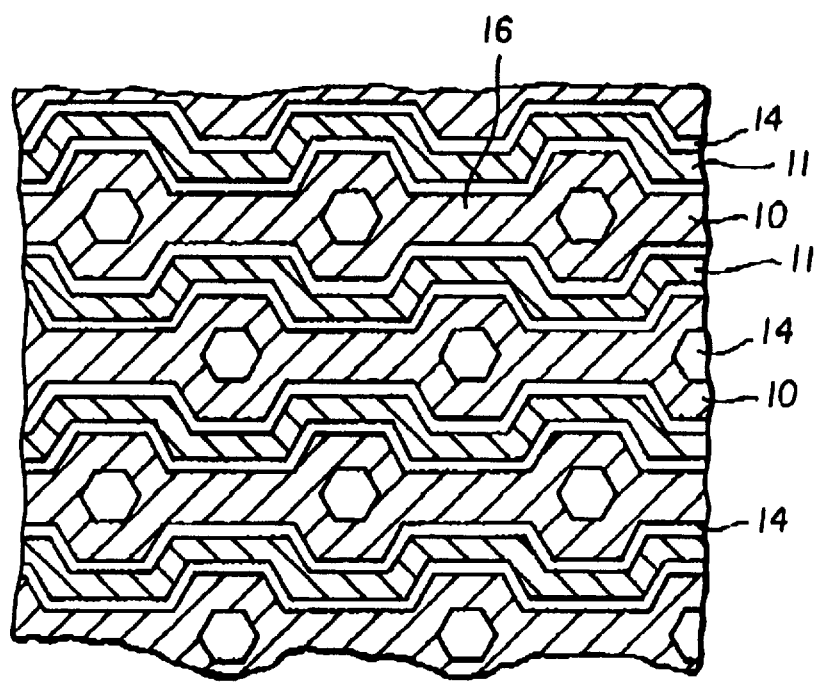
FIG. 8 is a cross sectional view taken across a horizontal plane extending through the middle of gate electrodes of an insulated gate thyristor as the fifth embodiment of the present invention.

FIG. 8 is a cross sectional view of an insulated gate thyristor according to the fifth embodiment of the present invention, taken across a plane extending through the middle of the gate electrode 10. In this insulated gate thyristor, the second p base regions 6 and the n emitter regions 8 formed in their surface layers are patterned in hexagonal shape, and the insulating film 14 include hexagonal portions formed on the surfaces of these regions 6, 8, as shown in FIG. 8. The pattern of the second p base regions 6 and the n emitter regions 8 formed in their surface layers is not shown in the figure, since these regions 6, 8 are formed under the gate electrode 10. Each hexagonal portion of the insulating film 14 is surrounded by the hexagonal gate electrode 10 having a hexagonal center hole, and the cathode 11 extends along side faces of a plurality of the hexagonal gate electrodes 10 while bending sideways, with the insulating film 14 interposed between the gate electrode 10 and the cathode 11. The adjacent gate electrodes 10 are connected to each other by a gate runner 16. The cathode 11, which is shown in the shape of bent lines in FIG. 8, actually extends over the gate electrodes 10, through the insulating film 14. In this arrangement in which the second p base regions 6 are surrounded by the first p base regions 4, the n source regions 7 in their surface layers, and the cathode 11 contacting the surfaces of these regions 4, 7, the current localization or concentration does not occur upon turn-off of the device, and the controllable current can be set at a relatively large value. It is to be understood that the second p base regions 6 and the n emitter regions 8 formed in their surface layers may be patterned in other shape than hexagonal shape.

Sixth Embodiment

Figure 9A:
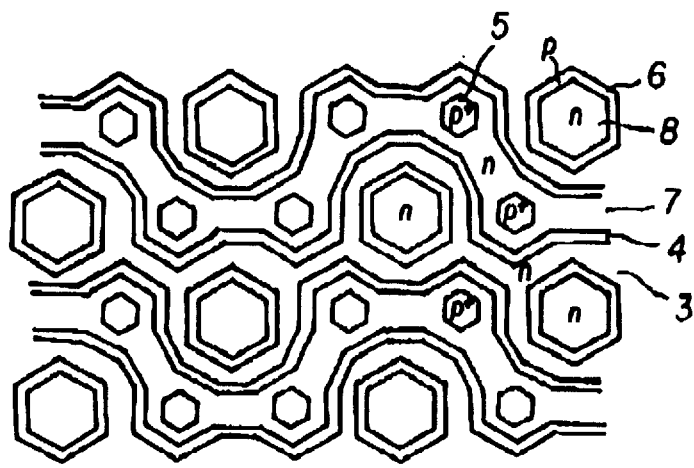
FIG. 9(a) is a plan view showing a surface of a silicon substrate of an insulated gate thyristor as the sixth embodiment of the present invention.
Figure 9B:
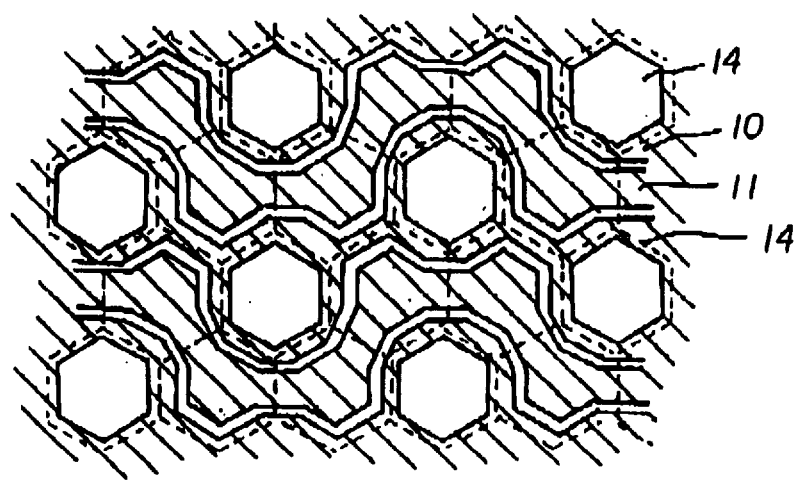
FIG. 9(b) is a cross sectional view taken across a horizontal plane extending through the middle of gate electrodes thereof.

FIG. 9(b) is a cross sectional view of an insulated gate thyristor according to the sixth embodiment of the present invention. FIG. 9(a) is another view of this insulated gate thyristor, showing diffusion regions 4, 6, 7 and 8 on a surface of the silicon substrate from which the cathode 11, insulating film 14 and gate electrode 10 are removed. Referring first to FIG. 9(a), hexagonal second p base regions 6 and n emitter regions 8 formed in their surface layers are formed in the surface layer of the n base region 3. The first p base regions 4 are formed in generally annular shape so as to surround the second p base regions 6, and the n source regions 7 and the p$^+$ well regions 5 are formed within the first p base regions 4. The first p base regions 4 and n source regions 7 are formed by introducing impurities through masks part of which are provided by the gate electrodes 10. As shown in FIG. 9(a), the generally annular p base regions 4 include discontinuities in the circumferences thereof, through which the n base layers 3 of adjacent cells are connected to each other.

FIG. 9(b) shows hexagonal portions of the insulating film 14, the gate electrodes 10 surrounding these portions of the film 14, and the cathodes 11 extending along side faces of the gate electrodes 10 while bending sideways, with the insulating film 14 interposed therebetween. The hexagonal portions of the insulating films 14 are located on the surfaces of the second p base regions 6 and the n emitter regions 8 formed therein. The opposite edges of the gate electrode 10 of each cell are located above the n emitter region 8 and the n source region 7, respectively. The cathode 11 contacts the surfaces of the n source regions 7 and p$^+$ well regions 5. Each of the hexagonal portions of the insulating film 14 may be considered to be surrounded by six unit cells as divided by dotted lines in FIG. 9(*b*), each of which cells consists of a generally hexagonal gate electrode 10 with a hexagonal center hole, cathode 11, and insulating film 14 that separates the gate electrode 10 from the cathode 11. The generally hexagonal gate electrode 10 includes two discontinuities, or lacks two edges, through which the first p base region 4 and n source region 7 of one cell are connected with those of its adjacent cell. The cathode 11, which is shown in the shape of bent lines in FIG. 9(*b*), actually extends over the gate electrodes 10, through the insulating film 14. The basic pattern of this structure is of hexagonal shape, thus allowing the cells to be arranged with the highest density. Thus, the silicon substrate can be utilized with considerably high efficiency. Further, the ON-state voltage is lowered due to increased areas of the first p base region 4 and the n source region 7. As in the insulated gate thyristor of the first embodiment, these devices of FIGS. 8, 9(*a*) and 9(*b*) provide low ON-state voltages and large RBSOAs because the pn junction between the n emitter region 8 and the second p base region 6 can uniformly resume its reverse-blocking ability, and the second p base region 6 functions as a bypass of the hole current.

Seventh Embodiment

Figure 10:
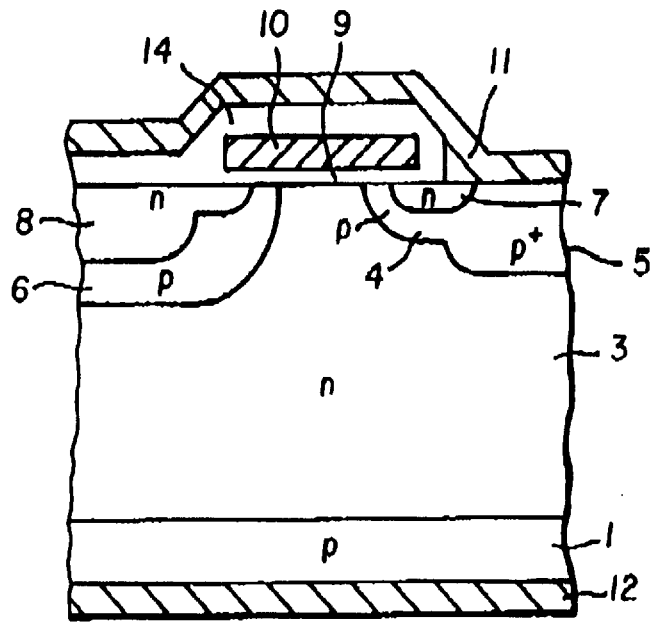
FIG. 10 is a fragmentary cross sectional view of an insulated gate thyristor of the seventh embodiment of the present invention.

While the n$^+$ buffer layer 2 is provided between the p emitter layer 1 and the n base layer 3 in any of the devices of the illustrated embodiments, the present invention is equally applicable to a device having no n$^+$ buffer layer 2. FIG. 10 is a fragmentary cross sectional view of an insulated gate thyristor according to the seventh embodiment of the present invention, which is produced using a bulk silicon wafer, rather than an epitaxial wafer. While the structure on one of major surfaces of the n base layer 3 formed from the bulk silicon wafer is the same as that of the first embodiment of FIG. 1, the present embodiment differs from the first embodiment in that the p emitter layer 1 is directly formed on the other surface of the n base layer 3.

Figure 11:
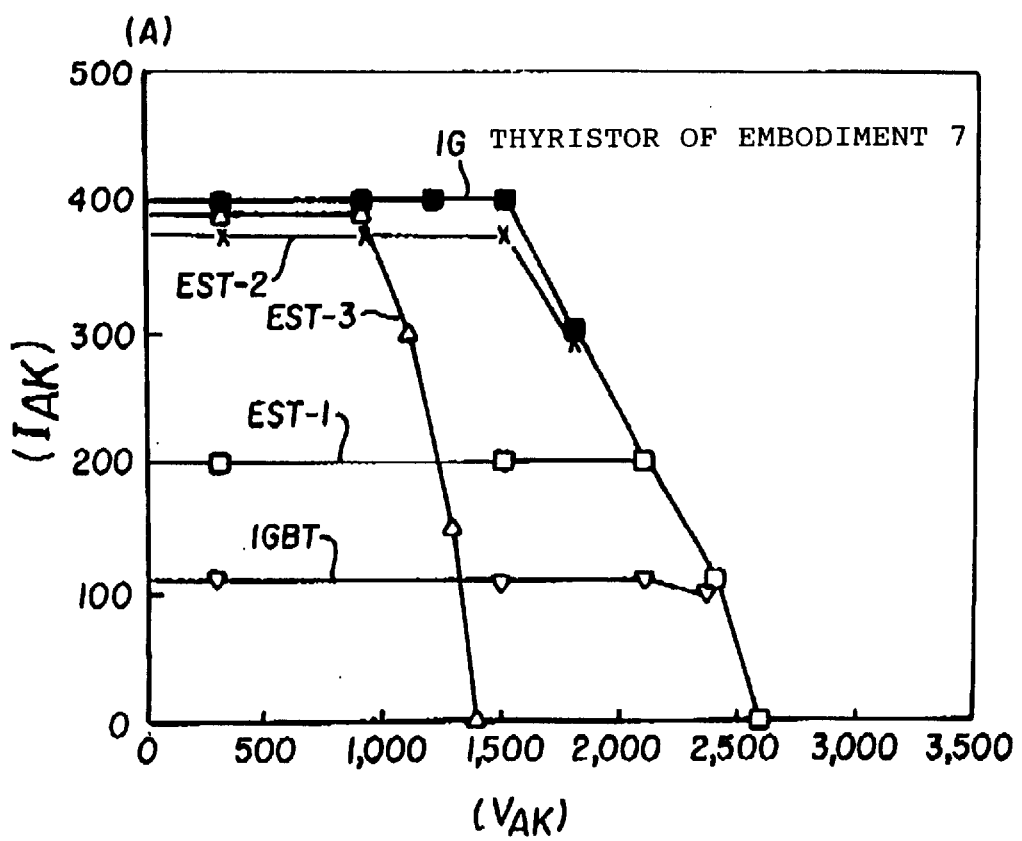
FIG. 11 is a graph showing the RBSOAs of 2500 V-class devices of the seventh embodiment of the invention and comparative examples.

The graph of FIG. 11 shows results of measurements of the reverse bias safe operation areas (RBSOA) as measured at 125° C. with respect to 2500 V-class devices of the insulated gate thyristor of FIG. 10 as the seventh embodiment of the present invention, and EST-1 of FIG. 43, EST-2 of FIG. 44, EST-3 of FIG. 45, and IGBT as comparative examples. In the graph of FIG. 11, the axis of abscissa indicates voltage between the anode and the cathode, and the axis of ordinates indicates electric current. The thickness of the n base layer 3 was 350 μm. The ON-state voltages of these five devices were 1.1 V, 2.0 V, 2.2 V, 1.4 V and 3.3 V, respectively. Thus, the device of the present invention using the bulk wafer, as well as the above-indicated 600 V-class device using the epitaxial wafer, provided a far larger RBSOA and a relatively low ON-state voltage, as compared with those of the ESTs and IGBT. Namely, the effects of the present invention do not vary depending upon the resistivity of the n base layer 3 and the current amplification factor of the pnp wide base transistor, and the RBSOA can be significantly increased without even slightly increasing the ON-state voltage. In other words, the present invention is effective to reduce the ON-state voltage and increase the RBSOA, without regard to a rated voltage of the device, and a method of producing a semiconductor crystal of the substrate of the device.

Figure 12:
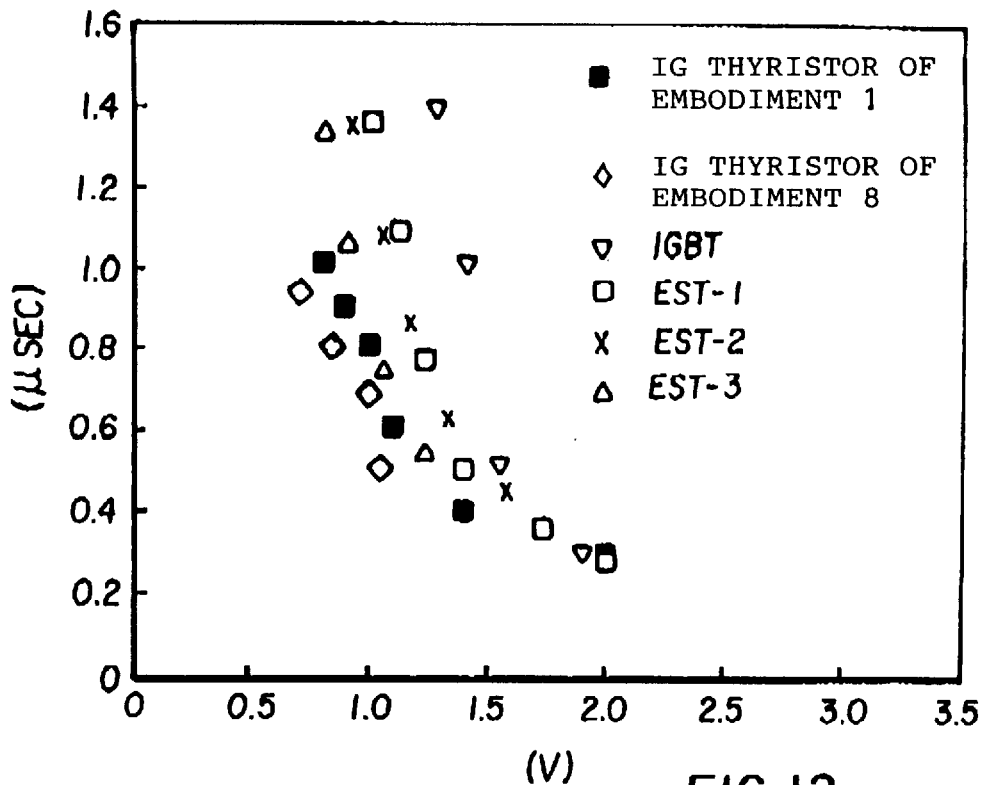
FIG. 12 is a graph showing trade-off characteristics between the ON-state voltage and the turn-off time of 600

The graph of FIG. 12 shows a trade-off characteristic between the ON-state voltage and turn-off time of the 600 V-class devices as described above, and the graph of FIG. 13 shows a trade-off characteristic between the ON-state voltage and turn-off time of the 2500-class devices. The axis of abscissa indicates the ON-state voltage, and the axis of ordinates indicates the turn-off time. The ON-state voltage was defined by a fall of potential occurring at 25° C. when a current of 100 A.cm$^2$ was conducted through the 600 V-class device, or when a current of 50 A.cm$^2$ was conducted through the 2500 V-class device. The turn-off time was measured at 125° C. It was found that in either case, the device of the present invention exhibited a better trade-off characteristic than the ESTs and IGBT.

The lower ON-state voltage can be achieved because the diffusion depths of the second p base region 6 and the n emitter region 8 are made larger than those of the first p base region 4 and the n source region 7, respectively, so as to increase the current amplification factor of the npn transistor of the thyristor portion, and the second p base region 6 and the first p base region 4 face each other over an increased length or area. The device of the present invention can be rapidly turned on because the pn junction between the second p base region 6 and the n emitter region 8 uniformly resumes its reverse-blocking ability, and the second p base region 6 and the first p base region 4 face each other over an increased length or area, thus causing current dispersion.

Similarly, the insulated gate thyristors of the second through sixth embodiments, having different patterns from that of the first embodiment, those having octagonal, dodecagonal and elliptical patterns, and 2500 V-class devices having these patterns exhibited better trade-off characteristics than the ESTs and IGBT.

Eighth and Ninth Embodiments

Two examples of insulated gate thyristors similar to the first embodiment were produced such that the lifetime of carriers was controlled by irradiation of protons and injection of helium ions, respectively. In particular, the crystal defects which provide lifetime killers can be localized by these methods, i.e., irradiation of protons and injection of helium ions. The conditions for the irradiation of protons were such that the accelerating voltage was 10 MeV, and the dose amount was in the range of $1 \times 10^{11}$ to $1 \times 10^{12}$cm$^{-2}$. The proton-irradiated areas were then annealed at 350° to 370° C. The injection of helium ions was effected in substantially the same dose as the irradiation of protons. The device in which the carrier lifetime was controlled by irradiation of protons is regarded as the eighth embodiment of the present invention, and the device in which the carrier lifetime was controlled by injection of helium ions is regarded as the ninth embodiment of the invention.

FIG. 12 shows a trade-off characteristic between the ON-state voltage and the turn-off time of the device described above as the eighth embodiment of the present invention. The ninth embodiment in which the lifetime control was effected by injection of helium ions exhibited substantially the same characteristic (not shown in FIG. 12) as the eighth embodiment. It will be understood from FIG. 12 that the insulated gate thyristor fabricated according to the eighth embodiment exhibits an even better trade-off characteristic than the device of the first embodiment subjected to electron beam irradiation, as well as the devices of the comparative examples. Since the crystal defects that provide lifetime killers are localized in the vicinity of the n+ buffer layer 2, by irradiation of protons from the anode 12, so as to optimize distribution of the lifetime killers, the lifetime killers are not anymore present in unnecessary portions, whereby the ON-state voltage is prevented from increasing due to such unnecessary lifetime killers. Thus, the obtained insulated gate thyristor has a relatively short turn-off time and low ON-state voltage.

The reverse bias safe operation areas (RBSOA) of the insulated gate thyristors of the eighth and ninth embodiments of the present invention were measured at 125° C., using the circuit as shown in FIG. 5. The results of the measurements were almost the same as that (shown in FIG. 4) of the insulated gate thyristor of the first embodiment.

Tenth Embodiment and Eleventh Embodiment

Two examples of 2500 V-class insulated gate thyristors similar to the seventh embodiment using a bulk silicon wafer were produced such that the lifetime of carriers was controlled by irradiation of protons and injecting of helium ions, respectively. The device in which the carrier lifetime was controlled by irradiation of protons is regarded as the tenth embodiment of the present invention, and the device in which the carrier lifetime was controlled by injection of helium ions is regarded as the eleventh embodiment of the invention.

FIG. 13 shows a trade-off characteristic between the ON-state voltage and the turn-off time of the device described above as the tenth embodiment of the present invention. The eleventh embodiment in which the lifetime control was effected by injection of helium ions exhibited substantially the same characteristic (not shown in FIG. 13) as the tenth embodiment. It will be understood from FIG. 13 that the insulated gate thyristor fabricated according to the tenth embodiment exhibits an even better trade-off characteristic than the device of the seventh embodiment subjected to electron beam irradiation, as well as the devices of the comparative examples.

The reverse bias safe operation area (RBSOA) of the 2500 V-class insulated gate thyristor of the tenth embodiment of the present invention was measured at 125° C., using the circuit as shown in FIG. 5. The result of the measurement was almost the same as that (shown in FIG. 11) of the insulated gate thyristor of the seventh embodiment. It will be understood that the devices constructed according to the present invention, including not only the 600 V-class devices using epitaxial wafers but also the 2500 V-class devices using bulk wafers, have a significantly increased reverse bias safe operation area, high breakdown withstand capability, and reduced ON-state voltage, as compared with the conventional IGBT and EST.

Twelfth Embodiment

FIG. 14 is a fragmentary cross sectional view of an insulated gate thyristor according to the twelfth embodiment of the present invention. The structure of this thyristor shown in cross section is somewhat different from that of the insulated gate thyristor of the first embodiment of FIG. 1. Specifically, a trench 17 is formed in a surface layer on one side of opposite major surfaces of an n base layer 3 having a relatively high resistivity. A first p base region 4 and a second p base region 6 are formed on the opposite sides of the trench 17. An n source region 7 is formed in a part of a surface layer of the first p base region 4, and an n emitter region 8 is formed in a surface layer of the second p base region 6, such that the n source region 7 and n emitter region 8 are exposed to walls defining the trench 17. A gate electrode 10 formed of polycrystalline silicon fills the inside of the trench 17, through a gate oxide film 9, so as to provide an n channel type MOSFET. In order to avoid latch-up of a parasitic thyristor, a p+ well region 5 is formed in a part of the first p base region 4. A cathode 11 is in contact with surfaces of the n source region 7 and p+ well region 5. Since this structure having the trench 17 is less likely to suffer from latch-up of the parasitic thyristor, compared to that of the ordinary planar type, the depth of the p+ well region 5 may be smaller than that of the first p base region 4. The diffusion depth of the second p base region 6 is larger than that of the first p base region 4. On the other side of the opposite surfaces of the n base layer 3, there is formed a p emitter layer 1 through an n+ buffer layer 2. As in the first embodiment of FIG. 1, the n emitter region 8 and the upper surface of the gate electrode 10 are covered with an insulating film 14 made of phosphorus glass (PSG), for example. As shown in FIG. 14, the cathode 11 extends over the n emitter region 8, through the insulating film 14. The lifetime of carriers is controlled by irradiation of protons. The trench 17 has a width of 1 μm and a depth of about 8 μm. The first and second p base regions 4, 6 have respective diffusion depths of 3 μm and 5 μm, and the n emitter region 8 and the n source region 7 have respective depths of 2 μm and 0.4 μm. The cell pitch is 3.5 μm.

FIG. 16 is a plan view of a surface of a silicon substrate of the insulated gate thyristor including a plurality of cells each of which is shown in FIG. 14. In FIG. 16, the same reference numerals as used in FIG. 14 are used to identify corresponding elements. The n emitter regions 8, n source regions 7, p+ well regions 5 and gate electrodes 10 separating the regions 8 from the regions 7, 5 are all arranged in the form of stripes.

The insulated gate thyristor thus formed is operated in the same manner as the illustrated embodiments. Namely, the thyristor is turned on and off by application of signal voltage to the gate electrode 10.

This insulated gate thyristor is different from the EST of FIG. 43 in that the surfaces of both of the second p base region 6 and the n emitter region 8 are covered with the insulating film 14, and the second p base region 6 is not in contact with the cathode 11. Accordingly, this device can be rapidly shifted from the IGBT mode to the thyristor mode, without requiring the hole current flowing in the Z direction through the second p base region as in the conventional EST. Further, the ON-state voltage is lowered since electrons are uniformly injected from the entire n emitter region 8. At the time of turn off, on the other hand, the pn junction between the n emitter region 8 and the second p base region 6 uniformly resumes its reverse-blocking ability, due to the potential difference therebetween, without suffering from concentration of current in a limited area, whereby the reverse bias safe operation area (RBSOA) is significantly increased due to the absence of the current concentration.

The graph of FIG. 15 shows results of measurements of the reverse bias safe operation areas (RBSOA) of the insulated gate thyristor shown in FIG. 14 as the twelfth embodiment of the present invention, and the above-described EST-1 of FIG. 43, EST-2 of FIG. 44, EST-3 of FIG. 45, and an IGBT as comparative examples. The RBSOA was measured at 125° C. with the measuring circuit as shown in FIG. 5. In the graph of FIG. 15, the axis of abscissa indicates voltage ($V_{AK}$) between the anode and the cathode, and the axis of ordinates indicates electric current.

The five specimens of thyristors whose RBSOAs are shown in FIG. 15 were produced as 600 V-class devices, using epitaxial wafers having the same specification as that used in the first embodiment. The chip size of the specimens was 1 cm². The ON-state voltage, as defined by a fall of potential occurring upon conduction of current of 100 A.cm⁻², was 0.8 V for the insulated gate thyristor of the twelfth embodiment of the present invention. It will be understood from FIG. 15 that the device of the twelfth embodiment of the present invention has a safe operation area that is three times as large as that of the IGBT, and two and a half times as large as those of the EST-1 and EST-3, assuring relatively high breakdown withstand capability. Further, the ON-state voltage of the device of the invention is lower than those of the other devices. The breakdown withstand capability of the device of the twelfth embodiment is 1.2 times as high as that of the EST-2. Thus, according to the present invention, the ON-state voltage can be lowered without affecting other characteristics.

This is because the cell pitch is reduced due to provision of trenches in the device, leading to a significantly increased cell density. Another reason for the reduction in the ON-state voltage is that the stripe-shaped second p base region 6 and n emitter region 8 in its surface layer face the similarly stripe-shape first p base region 4 and n source region 7 in its surface layer, over the entire length of the stripes, thus avoiding current concentration or localization.

With protons irradiated from the anode 12, the crystal defects which provide lifetime killers are localized in the vicinity of the n⁺ buffer layer 2, to optimize distribution of the lifetime killers, so that the lifetime killers do not appear in unnecessary portions. This avoids an increase in the ON-state voltage due to unnecessary lifetime killers.

Thirteenth Embodiment

FIG. 17 is a plan view showing a silicon surface of an insulated gate thyristor according to the thirteenth embodiment of the present invention. In this embodiment, each of n emitter regions 8 is located inside a gate electrode 10 having a square shape with a square center hole, which is embedded in a trench 17. In FIG. 17, n source region 7 is found outside the gate electrode 10, and p⁺ well region 5 is found outside the n source region 7. Second p base regions 6 formed under the n emitter regions 8, and first p base region 4 formed under the n source regions 7 are not shown in FIG. 17. The square gate electrodes 10 having square holes are connected with each other through a conductor (not shown) formed on the silicone surface.

The device of the thirteen embodiment has a relatively large RBSOA and reduced ON-state voltage, since the cell pitch is reduced due to provision of trenches, and the cell density is accordingly significantly increased. Further, the second p base region 6 and the n emitter region 8 in its surface layer are formed in square shape, and are surrounded by the first p base region 4 and the n source region 7 in its surface layer. This arrangement ensures an increased facing area or length between the regions 6, 8 and the regions 4, 7, and is therefore free from current concentration, assuring the increased RBSOA and reduced ON-state voltage.

Fourteenth Embodiment

An insulated gate thyristor was produced as the fourteenth embodiment of the present invention, using a bulk silicon wafer, instead of the epitaxial wafer.

The graph of FIG. 18 shows results of measurements of the reverse bias safe operation areas (RBSOA) of the insulated gate thyristor of the fourteenth embodiment having the pattern of FIG. 16, and 2500 V-class devices of the above-indicated EST-1, EST-2, EST-3, and IGBT as comparative examples. The RBSOA was measured at 125° C. In the graph of FIG. 18, the axis of abscissa indicates the voltage between the anode and the cathode, and the axis of ordinates indicates the electric current. The thickness of the n base layer 3 of each specimen was 350 µm. The ON-state voltage of the insulated gate thyristor of the fourteenth embodiment was 0.9 V. The lifetime of carriers was controlled by irradiation of protons. The insulated gate thyristors constructed according to the present invention, including not only 600 V-class devices using epitaxial wafers but also 2500 V-class devices using bulk wafers, provide a far larger RBSOA and a relatively low ON-state voltage, as compared with the conventional EST and ISBT. Namely, the effects of the present invention do not vary depending upon the resistivity of the n base layer 3 and the current amplification factor of the pnp wide base transistor, and the RBSOA can be significantly increased without even slightly increasing the ON-state voltage. In other words, the present invention is effective to reduce the ON-state voltage and increase the RBSOA, without regard to a rated voltage of the device, and a method of producing a semiconductor crystal of the substrate of the device.

The graph of FIG. 19 shows a trade-off characteristic between the ON-state voltage and turn-off time of the twelfth embodiment described above and the IGBT and EST-3 of FIG. 45 as comparative examples, and the graph of FIG. 20 shows a trade-off characteristic between the ON-state voltage and turn-off time of the fourteenth embodiment and the IGBT and EST-3 as comparative examples. Among the above-indicated ESTs as comparative examples, the EST-3 shown in FIG. 45 exhibited a better trade-off characteristic between the ON-state voltage and turn-off time, though its withstand voltage was low. In the graphs of FIGS. 19, 20, the axis of abscissa indicates the ON-state voltage, and the axis of ordinates indicates the turn-off time. The ON-state voltage is defined by a fall of potential occurring at 25° C. when a current of 100 A.cm² was conducted through the 600 V-class device, or when a current of 50 A.cm² was conducted through the 2500 V-class device. The turn-off time was measured at 125° C. It was found that in either case, the devices of the twelfth and fourteenth embodiments having the pattern of FIG. 16 exhibited better trade-off characteristics than the IGBT and EST. This is because the cell pitch of those devices is reduced due to provision of trenches, and the cell density is accordingly significantly increased. Further, the stripe-shaped second p base region 6 and n emitter region 8 in its surface layer face the similarly stripe-shaped first p base region 6 and n source region 7 in its surface layer, over the entire length of the stripes, whereby the current concentration or localization is avoided, and the pn junction uniformly resumes its reverse-blocking capability. This also leads to good trade-off characteristics.

Insulated gate thyristors of the same structure having hexagonal, octagonal, circular or other pattern also exhibited good trade-off characteristics.

Fifteenth Embodiment

FIG. 21 is a fragmentary plan view showing a surface of a silicone substrate of an insulated gate thyristor according to the fifteenth embodiment of the present embodiment, as viewed through gate electrodes 10, 10'. In the figure, the opposite edges of the gate electrodes 10, 10' are indicated by finely dotted lines. The first p base regions 4 and the second p base regions 6 are formed in stripe shape such that these regions 4, 6 face each other over the entire length of the stripes. An n emitter region 8 is formed in each of the second p base regions 6, while an n source region 7 is formed in each of the first p base regions 4. The thyristor shown in FIG. 21 include not only gate electrodes 10 each having opposite edges which lie above the n emitter region 8 and the n source region 7, respectively, but also gate electrodes 10' each having opposite edges both of which lie above the n source regions 7.

Figure 23A:
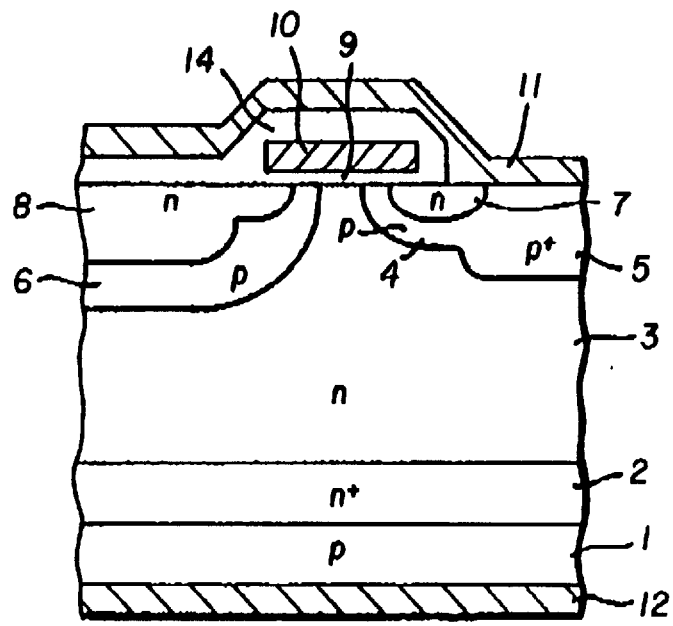
Figure 23B:
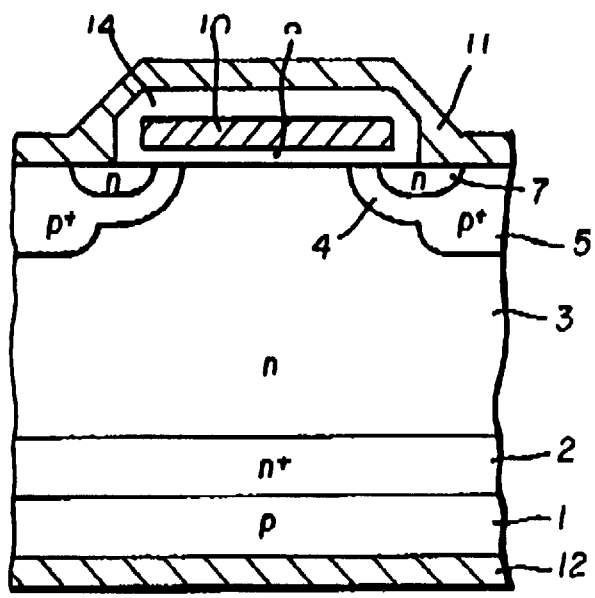

FIG. 23(a) is a cross sectional view taken along line A–A' of FIG. 21, and FIG. 23(b) is a cross sectional view taken along line B–B' of FIG. 21.

More specifically, the cross sectional view of FIG. 23(a) shows a structure taken along a line that connects the n emitter region 8 with the n source region 7, and the cross sectional view of FIG. 23(b) shows a structure taken along a line that connects two adjacent n source regions 7 with each other. The gate electrode 10' shown in FIG. 23(b) has a larger width than the gate electrode 10 shown in FIG. 23(a). For example, the width of the gate electrode 10 of FIG. 23(a) is 15 µm, and the width of the gate electrode 10' of FIG. 23(b) is 30 µm.

The insulated gate thyristor of FIG. 21 can be produced by almost the same method as employed for producing the IGBT, using different masks for forming diffusion regions.

Sixteenth Embodiment

FIG. 22 is a fragmentary plan view showing a semiconductor substrate of an insulated gate thyristor according to the sixteenth embodiment of the present invention, as viewed through the gate electrode 10. The profile of the gate electrode 10 is indicated in dotted lines. Each of hexagonal n emitter regions 8 outlined by thick solid lines is surrounded by six hexagonal n source regions 7, and this arrangement or pattern is repeated over the semiconductor substrate. First p base regions formed outside the n source regions 7 and second p base regions formed outside the n emitter regions 8 are not shown in this figure. The cross sectional view of this structure taken along line C–C' that connects the n emitter region 8 with the n source region 7 is almost identical with that of FIG. 23(a), and the cross sectional view taken along line D–D' that connects the adjacent n source regions 7 with each other is almost identical with that of FIG. 23(b). The surfaces of the second p base region 6 and n emitter region 8 are covered with the insulating film 14, and are not in contact with the cathode 11. In the device having such a polygonal cell pattern as described above, the n base region 3 provides a relatively small spacing between the n emitter region 8 and the n source region 7, and provides a relatively large spacing between the adjacent n source regions 7, 7.

The graph of FIG. 24 shows a trade-off characteristic between the ON-state voltage and the turn-off time of the insulated gate thyristor of the sixteenth embodiment shown in FIG. 22, and those of the IGBT and EST-3 as comparative examples. The axis of abscissa indicates the ON-state voltage, and the axis of ordinates indicates the turn-off time. The ON-state voltage is defined by a fall of potential occurring at 25° C. when a current of 100 A.cm$^2$ was conducted through the device. The turn-off time was measured at 125° C. The lifetime of carriers was controlled by irradiation of protons.

As is understood from FIG. 24, the insulated gate thyristor of the sixteenth embodiment shows a better trade-off characteristic, compared to the IGBT and EST-3. This is because the n base layer 3 provides a relatively small spacing between the n emitter region 8 and the n source region 7, with results of relatively small resistance of an accumulation layer during operation of the MOSFET, and reduced ON-state voltage. Further, the present device is free from effects of the junction type field-effect transistor (JFET) during the initial period of the turn-on operation, and electrons are rapidly drawn through channels, due to the relatively large spacing between the adjacent n source regions 7 in the n base layer 3. Thus, the insulated gate thyristor of the sixteenth embodiment assures a large safe operation area, a short turn-off time and a large controllable current.

With protons irradiated from the anode 12, the crystal defects that provide lifetime killers are localized in the vicinity of the n$^+$ buffer layer 2, so as to optimize distribution of the lifetime killers, so that the lifetime killers are not anymore present in unnecessary portions. This is effective to avoid an undesirable increase in the ON-state voltage due to those unnecessary lifetime killers.

The reverse bias safe operation area (RBSOA) of the insulated gate thyristor of the sixteenth embodiment was measured at 125° C., using the measuring circuit of FIG. 5. The result is almost the same as that of the insulated gate thyristor of the first embodiment as shown in FIG. 4. The ON-state voltage, as defined by a fall of potential occurring upon conduction of current of 100 A.cm$^{-2}$, was 0.8 V.

Seventeenth Embodiment

While the insulated gate thyristor of the sixteenth embodiment includes the n$^+$ buffer layer 2 formed between the p emitter layer 1 and the n base layer 3, the present invention is equally applicable to a similar device having no n$^+$ buffer layer. A specimen of insulate gate thyristor was produced as the seventeenth embodiment of the present invention, in which the structure on one of major surfaces of the n base layer 3 formed from a bulk silicon wafer was the same as that of the sixteenth embodiment of FIG. 23, but the p emitter layer 1 was directly formed on the other or rear surface of the p emitter layer 1. The lifetime of carriers was controlled by irradiation of protons. The thickness of the n base layer 3 was 350 µm.

The graph of FIG. 25 shows trade-off characteristics between the ON-state voltage and the turn-off time of the insulated gate thyristor of the seventeenth embodiment having the pattern of FIG. 22, and 2500 V-class devices of IGBT and EST-3 as comparative examples. The axis of abscissa indicates the ON-state voltage, and the axis of ordinates indicates the turn-off time. The ON-state voltage was defined by a fall of potential occurring at 25° C. upon conduction of current of 50 A.cm$^{-2}$. The turn-off time was measured at 125° C. It will be understood from FIG. 25 that the device of the seventeenth embodiment exhibited a better trade-off characteristic than the IGBT and EST-3. Thus, the insulated gate thyristor as the seventeenth embodiment of the invention assures a large safe operation area, a short turn-off time, and a large controllable current. In this particular embodiment, the thyristor exhibited a further improved trade-off characteristic due to the effect of irradiation of protons.

The reverse bias safe operation area (RBSOA) of the 2500 V-class device of the seventeenth embodiment was measured at 125° C., using the measuring circuit of FIG. 5. The result was almost the same as that of the insulated gate thyristor of the seventh embodiment shown in FIG. 10. The ON-state voltage, as defined by a fall of potential occurring at 25° C. upon conduction of current of 50 A.cm$^{-2}$, was 1.0 V. Thus, the devices constructed according to the present invention, including not only 600 V-class devices using epitaxial wafers, but also 1200 V-class devices using bulk wafers, have significantly increased RBSOA, relatively high breakdown withstand capability and low ON-state voltage, as compared with the conventional IGBT and EST.

Another device in which the control of the carrier lifetime was effected by injection of helium ions exhibited substantially the same characteristic as the seventeenth embodiment wherein the lifetime control was effected by irradiation of protons.

Eighteenth Embodiment

FIG. 26 is a fragmentary cross sectional view of an insulated gate thyristor according to the eighteenth embodiment of the present invention.

The thyristor shown in this figure is different from the insulated gate thyristor of the first embodiment of FIG. 1 in that an n$^+$ auxiliary region 18 having a higher impurity concentration than the n base layer 3 is formed in a part of a surface layer of the n base layer 3 which is located under the gate oxide film 9. In this insulated gate thyristor of the eighteenth embodiment, too, the surfaces of the second p base region 6 and the n emitter region 8 are both covered with the insulating film 14, and the second p base region 6 does not contact the cathode 11. The width of the n base layer 3 between the second p base region 6 and the first p base region 4 is about 20 μm, and the n$^+$ auxiliary region 18 has a surface impurity concentration of 3×10$^{17}$cm$^{-3}$, a diffusion depth of 0.4 μm, and a width of 10 μm.

FIG. 27 is a fragmentary plan view showing a surface of a silicon substrate of the device including a plurality of cells each of which is shown in FIG. 26, as seen through gate electrodes 10. As shown in FIG. 27 wherein the same reference numerals as used in FIG. 26 are used to identify corresponding elements, the n emitter regions 8 and the n source regions 7 are arranged in the form of stripes. Each of the n$^+$ auxiliary regions 18 also shaped like stripes are formed in an exposed portion of the surface of the n base layer 3 that is interposed between the corresponding n emitter region 8 and n source region 7. The p$^+$ well regions 5 are formed between the adjacent n source regions 7. The device further includes first p base regions 4 formed outside the n source regions 7, and second p base regions 6 formed outside the n emitter regions 8. The edges of the gate electrodes 10 are indicated by dotted lines.

The insulated gate thyristor of the eighteenth embodiment is rapidly shifted from the IGBT mode to the thyristor mode, without requiring the hole current flowing in the Z direction in the second p base regions as in the conventional EST. In addition, the ON-state voltage is lowered since electrons are uniformly injected from the entire n emitter region 8. At the time of turn-off, on the other hand, the pn junction between the n emitter region 8 and the second p base region 6 uniformly resumes its reverse-blocking ability, due to the potential difference therebetween. This prevents the current from being concentrated in a limited area, and thus assures a significantly increased RBSOA of the device.

TABLE 2 shows a result of comparison of the controllable current of the insulated gate thyristor (specimen I) of the eighteenth embodiment shown in FIG. 27, with that of an insulated gate thyristor (specimen II) having the same pattern of FIG. 27 but including no n$^+$ auxiliary region as a comparative example. The structure of this comparative example is similar to that of the first embodiment.

TABLE 2

| Specimen (n$^+$ auxiliary region) | Max. controllable current (V$_{AK}$ = 1000 V) | ON-state voltage (50 A · cm$^{-2}$) | Withstand voltage |
|---|---|---|---|
| Specimen 1 Embodiment 18 (Yes) | 160 A | 2.32 V | 1350 V |
| Specimen 11 Comparative Ex. (No) | 80 A | 2.45 V | 1350 V |
| Specimen III Comparative Ex. (entirely doped) | 130 A | 2.28 V | 1200 V |

The specimens were produced as 1200 V-class devices, using a wafer in which the n$^+$ buffer layer in the form of a 5 μm-thickness n type layer having a resistivity of 0.03 Ω.cm, the n base layer in the form of a 115 μm-thickness n type layer having a resistivity of 80 Ω.cm were epitaxially grown on the p emitter layer 1 having a resistivity of 0.02 Ω.cm and a thickness of 115 μm. The width of the n source region 7 was 4 μm, and the chip size was 0.64 cm$^2$. It is understood from TABLE 2 that the maximum controllable current of the device of the eighteenth embodiment is twice as much as that of the comparative example having no n$^+$ auxiliary region, and the ON-state voltage of the present device is lower than that of the comparative example. This is because in the specimen I, the p channel is less likely to be formed under the gate oxide film 9 at the time of turn off, and the resistance in the channel is reduced. In addition to the specimens I and II, TABLE 2 shows characteristics of another comparative example as specimen III in which the entire surface area of the portion of the n base layer interposed between the first and second p base regions was doped with n type impurities by ion implantation. Although the maximum controllable current of this specimen III was significantly increased, and its ON-state voltage is lower than that of specimen I, the withstand voltage is lowered. Accordingly, the insulated gate thyristor of the eighteenth embodiment is generally more excellent than the one in which n type impurities in the form of ions were implanted over the entire surface area of the n base layer.

Nineteenth Embodiment

FIG. 28 is a fragmentary plan view showing a surface of a silicon surface of an insulated gate thyristor according to the nineteenth embodiment of the present invention, as seen through the gate electrode 10. As shown in FIG. 28 in which the same reference numerals as used in FIG. 26 are used to identify the corresponding elements, each of hexagonal n emitter regions 8 is surrounded by six hexagonal n source regions 7 having hexagonal holes. A net like n$^+$ auxiliary region 18 is formed in an exposed surface portion of the n base layer 3 interposed between the n emitter regions 8 and the n source regions 7. A p$^+$ well region 5 is located inside each of the n source regions 7. First p base regions (not shown) are located outside the n source regions 7, and second p base regions (not shown) are located outside the n emitter regions 8. The profile of the gate electrode 10 is indicated by dotted lines.

The graph of FIG. 29 shows the controllable current of the insulated gate thyristor (specimen IV) of the nineteenth embodiment 19 shown in FIG. 28 and that of an insulated gate thyristor (specimen V) having no n$^+$ auxiliary region as a comparative example. The structure of this comparative example is similar to that of the first embodiment of the invention. The axis of abscissa indicates voltage ($V_{AK}$) between the anode and the cathode, and the axis of ordinates indicates electric current ($I_{AK}$). It will be understood from FIG. 29 that the insulated gate thyristor (specimen IV) of the nineteenth embodiment has a larger controllable current than the device (specimen V) that is similar to the first embodiment.

TABLE 3 below indicates the maximum controllable currents and ON-state voltages of the above specimens IV, V for comparison, as well as those of the specimens I (eighteenth embodiment) and II.

TABLE 3

| Specimen ($n^+$ auxiliary region) | Specimen IV (Yes) Emb. 19 | Specimen V (No) | Specimen 1 (Yes) Emb. 18 | Specimen II (No) |
|---|---|---|---|---|
| Max. controllable current ($V_{AK}$ = 1000 V) | 180 A | 60 A | 160 A | 80 A |
| ON-state Voltage (50 A · cm$^{-2}$) | 2.20 V | 2.32 V | 2.32 V | 2.45 V |
| Pattern | Hexagonal cells | | Stripes | |

In TABLE 3, it is noted that the maximum controllable current of the device of the nineteenth embodiment is three times as much as that of the comparative example (specimen V) having no $n^+$ auxiliary region. This is because the provision of the $n^+$ auxiliary region 18 leads to dispersion of the current at the time of turn off, and the current is less likely to be concentrated in a limited area. The ON-state voltage of the present device (specimen IV) is relatively low since the channel resistance is lowered.

In TABLE 3 above, it is also noted that the maximum controllable current of the nineteenth embodiment having a pattern of hexagonal cells is larger than that of the eighteenth embodiment having a pattern of stripes, and that the ON-state voltage of the nineteenth embodiment is lower than that of the eighteenth embodiment. This is because these embodiments have different effects of JFET, and different overall channel lengths, that is, spacings between mutually facing portions of the second p base region 6 and n emitter region 8 in its surface layer, and the first p base region 4 and n source region 7 in its surface layer. Of the two specimens having no $n^+$ auxiliary region 18, the device having the hexagonal cell pattern has a larger maximum controllable current, probably due to the presence of an area or areas in which the current is concentrated. Since the channel resistance of this device is relatively large, any variation in the current may greatly influence on the controllable current.

Twentieth Embodiment and Twenty-first Embodiment

A 600 V-class insulated gate thyristor and a 4500 V-class insulated gate thyristor were produced as twentieth and twenty-first embodiments of the invention, respectively, each having a hexagonal cell pattern similar to that of the nineteenth embodiment, and the $n^+$ auxiliary region formed in a surface layer of the n base region between the first and second p base regions.

The maximum controllable current and ON-state voltage of the insulated gate thyristors of the twentieth and twenty-first embodiments of the invention were measured, and compared with those of 600 V-class and 4500 V-class insulated gate thyristors having no $n^+$ auxiliary regions. TABLE 4 shows the measurement results, as represented as the ratios to the current and voltage values obtained by the insulated gate thyristors having no $n^+$ auxiliary regions. For comparison, the maximum controllable current and ON-state voltage of the 1200 V-class device of the nineteenth embodiment are also indicated in TABLE 4.

TABLE 4

| | Max. controllable current*[1] | ON-state voltage*[2] |
|---|---|---|
| 20th Embodiment (600 V) | 3.2 | 0.96 |
| 19th Embodiment (1200 V) | 3.0 | 0.95 |
| 21st Embodiment (4500 V) | 2.8 | 0.93 |

*[1]Current values obtained by comparative devices having no $n^+$ auxiliary regions are regarded as 1.
*[2]Voltage levels obtained by comparative devices having no $n^+$ auxiliary regions are regarded as 1.

It will be understood from TABLE 4 that in the insulated gate thyristors in a wide withstand voltage range, the provision of the $n^+$ auxiliary region is effective to increase the maximum controllable current and lower the ON-state voltage. In particular, the low-withstand-voltage device provided with the $n^+$ auxiliary region has a significantly increased maximum controllable current, and the high-withstand-voltage device provided with the $n^+$ auxiliary region has a significantly lowered ON-state voltage.

Twenty-second Embodiment

While an epitaxial wafer was used in the nineteenth embodiment, a 1200 V-class insulated gate thyristor was produced as the twenty-second embodiment of the present invention, using an n-type wafer having a resistivity of 40 $\Omega$cm and a thickness of about 280 $\mu$m. This thyristor also had the hexagonal cell pattern.

The maximum controllable current and ON-state voltage of the twenty-second embodiment (specimen VI) were compared with those of a 1200 V-class device (specimen VII) using a bulk wafer and having no $n^+$ auxiliary region. The results are shown in TABLE 5 below.

TABLE 5

| Specimen ($n^+$ auxiliary region) | Max. controllable current | ON-state voltage (50 A · cm$^{-2}$) |
|---|---|---|
| Specimen V1 (Yes) 22nd Embodiment | 180 A | 2.42 V |
| Specimen (No) | 60 A | 2.55 V |

It will be understood from TABLE 5 that the provision of the $n^+$ auxiliary region is also effective to increase the maximum controllable current and reduce the ON-state voltage of the insulated gate thyristor using the bulk wafer, though the ON-state voltage is increased with an increase in the thickness of the n base layer.

Twenty-third Embodiment

FIG. 30 is a cross sectional view of an insulated gate thyristor according to the twenty-third embodiment of the present invention, taken across a horizontal plane extending through the middle of the gate electrode 10. In FIG. 30, there are shown some hexagonal portions of the insulating film 14 in the net structure of the gate electrode 10, and other hexagonal portions of the insulating film 14 having respective cathodes 11 each protruding in three directions. The insulating film portion 14 that does not have the cathode 11 is surrounded by six insulating film portions 14 having the cathodes 11. The dotted lines of FIG. 30 indicate pn junctions between the n source regions 7 and the p+ well regions 5.

FIG. 31 shows respective diffusion regions on a surface of a silicone substrate of the insulated gate thyristor of FIG. 30, from which the insulating film and electrode are removed. Each of hexagonal second p base regions 6 formed in a surface layer of the n base layer 3 is surrounded by six hexagonal first p base regions 4, and this pattern is repeated over the silicone substrate. A hexagonal source region 7 having a hexagonal hole filled with a p+ well region 5 is formed in each of the first p base regions 4, and a hexagonal n emitter region 8 is formed in each of the second p base regions 6. Most part of the substrate surface covered with the gate electrode 10 is an exposed surface portion of the n base layer 3. It is to be noted that the cathode 11 shown in FIG. 11 is disposed in contact with the n source regions 7 and the p+ well regions 5.

Figure 32A:
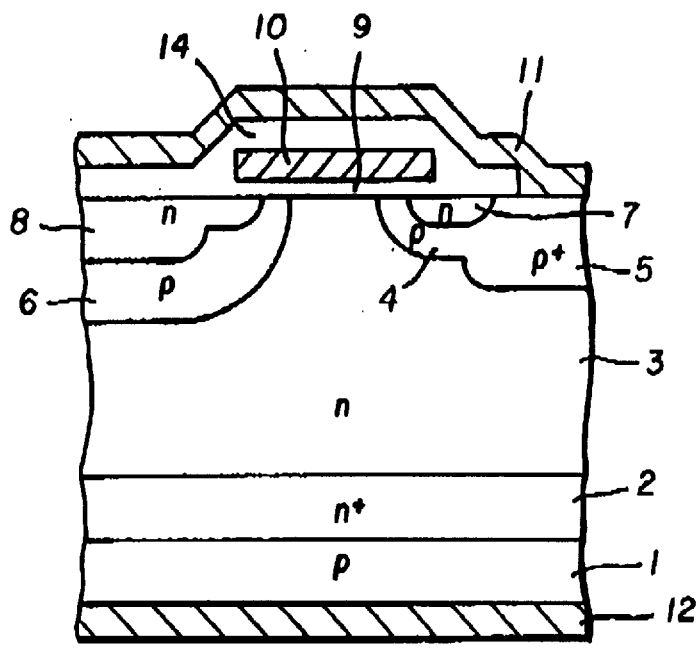
Figure 32B:
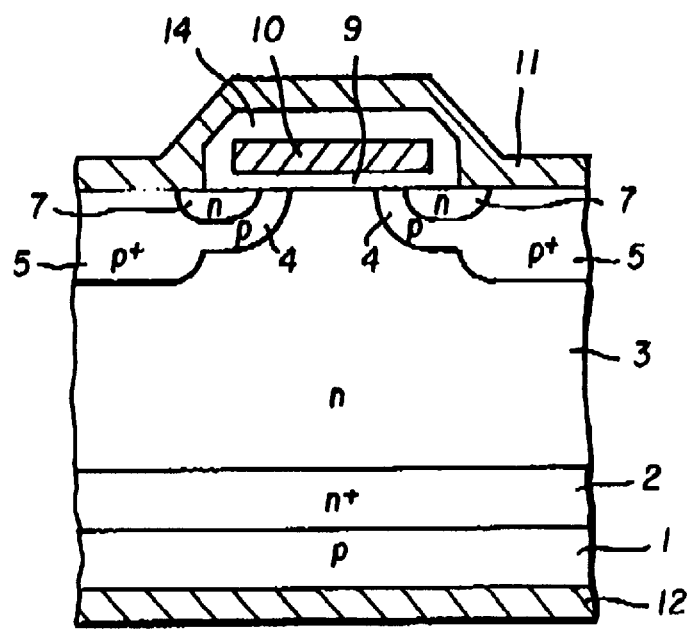

FIG. 32(a) is a cross sectional view taken along line E–E' of FIG. 30 connecting the insulating film 14 with the cathode 11, and FIG. 32(b) is a cross sectional view taken along line F–F' of FIG. 30 connecting the cathode 11 with the cathode 11. While the structure shown in cross section in FIG. 32(a) is similar to that of the first embodiment of FIG. 1, the entire surface of the n source region 7 is covered with the insulating film 14, and does not contact with the cathode 11. Namely, the cathode 11 is only in contact with the surface of the p+ well region 5.

In the cross section of FIG. 32(b), taken along line F–F' of FIG. 30 connecting the cathode 11 with the cathode 11, on the other hand, the cathode 11 is in contact with both of the surfaces of the first p base region 4 (p+ well region 5) and the n source region 7.

The insulated gate thyristor of FIG. 30 can be produced in substantially the same process as the insulated gate bipolar transistor (IGBT), using different masks for forming diffusion regions. The lifetime of carriers is controlled by irradiation of protons or implantation of helium ions. In particular, crystal defects which provide lifetime killers can be localized by such a method as irradiation of protons or injection of helium ions. The conditions for the irradiation of protons are such as described above.

The operation of the insulated gate thyristor thus formed is the same as that of the first embodiment of FIG. 1, and therefore will not be described in detail.

In the insulated gate thyristor of the twenty-third embodiment of FIG. 30, the surfaces of the second p base region 6 and the n emitter region 8 formed in its surface layer are covered with the insulating film 14, as shown in FIG. 32(a). As in the first embodiment, the thyristor including the n emitter region 8, second p base region 6, n base layer 3 and p emitter layer 1 is uniformly turned on and off, assuring a rapid switching characteristic and a large reverse bias safe operation area (RBSOA). The insulating film 14 also covers the surface of the n source region 7 formed in a part of the first p base region 4 which is close to the second p base region 6 and n emitter region 8, so that the relevant n source region 7 does not contact the cathode 11. Therefore, when the current flows from the n emitter region 8 of the thyristor portion to the n source region 7, through an inversion layer formed right under the gate electrode 10 upon turn off, the n source region 7 close to the second p base region 6 is not short-circuited with the cathode 11, thus making it difficult to cause latch-up of a parasitic thyristor including the n source region 7, first p base region 4, n base layer 3 and p emitter layer 1. Accordingly, the turn-off time can be advantageously reduced, as compared with conventional devices wherein the turn-off time is increased due to injection of electrons from the n source region 7.

Although the n source region 7 contacts the cathode 11 in a portion of the device where the n source regions 7 face each other, as seen in FIG. 32(b), this portion is not likely to latch up since the p+ well region 5 having a high impurity concentration is formed in a lower part of the first p base region 4.

The graph of FIG. 35 shows the trade-off characteristic between the ON-state voltage and the turn-off time of the insulated gate thyristor of the twenty-third embodiment shown in FIG. 30, and those of the IGBT and the EST-3 of FIG. 45 as comparative examples. The axis of abscissa indicates the ON-state voltage, and the axis of ordinates indicates the turn-off time. The ON-state voltage was defined by a fall of potential occurring at 25° C. when a current of 100 A.cm$^2$ was conducted through the device. The specimens were produced as 600 V-class devices, and the width of the n source region 7 was 4 μm. The width of the n emitter region 8 of the EST-3 was 20 μm. The chip size of each specimen was 1 cm$^2$. The lifetime of carriers was controlled by irradiation of protons. It will be understood from FIG. 35 that the insulated gate thyristor of the twenty-third embodiment exhibited a better trade-off characteristic than the IGBT and EST-3.

This is because the latch-up of the parasitic thyristor was prevented by covering the surface of the n source region 7 close to the second p base region 6, with the insulating film 14. In particular, the lifetime control was effected by irradiation of protons, so that crystal defects providing lifetime killers were localized, to optimize distribution of the lifetime killers. Thus, the lifetime killers did not appear in unnecessary portions, resulting in a further improved trade-off characteristic between the ON-state voltage and the turn-off time.

The reverse bias safe operation area (RBSOA) of the insulated gate thyristor of the twenty-third embodiment having the pattern of FIG. 30 and subjected to the lifetime control by irradiation of protons was measured at 125° C., using the measuring circuit shown in FIG. 5. The ON-state voltage, defined by a fall of potential occurring upon conduction of a current of 100 A.cm$^{-2}$, was 0.9 V. The RBSOA thus measured was almost the same as that of the insulated gate thyristor of the first embodiment of FIG. 1. Namely, the present thyristor of FIG. 30 had greater breakdown withstand capability and lower ON-state voltage than the IGBT and EST. This is because the n emitter region 8 and the second p base region 6 were formed in polygonal shape, and surrounded by a plurality of first p base regions 4, thus avoiding otherwise possible current concentration.

Another specimen of insulated gate thyristor of the present invention in which the lifetime of carriers was controlled by implantation of helium ions exhibited almost the same characteristic (not shown in FIG. 35) as the twenty-third embodiment in which the lifetime control was effected by irradiation of protons.

Twenty-fourth Embodiment

FIG. 33 is a cross sectional view of an insulated gate thyristor according to the twenty-fourth embodiment of the present invention, taken across a plane extending through the middle of the gate electrode 10. In this insulated gate thyristor, the first p base regions 4 and the n source regions 7 in their surface layers, and the second p base regions 6 and the n emitter regions 8 in their surface layers are formed through square holes provided in the gate electrode 10. The cathode 11 contacts the surfaces of the p base regions 4 and n source regions 7, through contact holes formed through the insulating film 14 deposited on the top and side faces of the gate electrode 10. The dotted lines of FIG. 33 indicate pn junctions between the n source regions 7 and the p+ well regions 5. The surfaces of the second p base regions 6 and the n emitter regions 8 formed in their surface layers are covered with the insulating film 14. In this embodiment, too, the surfaces of some portions of the n source regions 7 that face the second p base regions 6 are covered with the insulating film, and the surfaces of other portions of the n source regions 7 that face the first p base regions 4 are in contact with the cathode 11.

Twenty-fifth Embodiment

FIG. 34 is a cross sectional view of an insulated gate thyristor according to the twenty-fifth embodiment of the present invention, taken across a plane extending through the middle of the gate electrode 10. In this insulated gate thyristor, the first p base regions 4 and the n source regions 7 in their surface layers, and the second p base regions 6 and the n emitter regions 8 in their surface layers are formed through circular holes provided in the gate electrode 10. This embodiment is different from the twenty-third embodiment of FIG. 30 only in respect of its pattern, and these embodiments have the same arrangement of the gate electrode 10, cathode 11, and insulating film 14. In this embodiment, too, the surfaces of some portions of the n source regions 7 facing the second p base regions 6 are covered with the insulating film 14, and the surfaces of other portions of the n source regions 7 facing the first p base regions 4 are in contact with the cathode 11.

The trade-off characteristic between the ON-state voltage and the turn-off time was measured with respect to the insulated gate thyristors of FIGS. 33 and 34. The results were about the same as that of the twenty-third embodiment. In the thyristors of FIG. 33 and 34 in which the surfaces of the portions of the n source regions 7 close to the second p base regions 6 are covered with the insulating film 14, latch up of the parasitic thyristor can be avoided, resulting in the improved trade-off characteristics.

The RBSOAs of the insulated gate thyristors of FIGS. 33 and 34 were both larger than 1000 A.

Twenty-sixth Embodiment

While the n+ buffer layer 2 is provided between the p emitter layer 1 and the n base layer 3 in the insulated gate thyristor of the twenty-third embodiment shown in the cross sectional view of FIG. 32, the present invention is equally applicable to a similar device having no n+ buffer layer 2. An insulated gate thyristor was produced as the twenty-sixth embodiment of the invention, in which the structure on one of major surfaces of the n base layer 3 formed from a bulk silicon wafer is the same as that of the twenty-third embodiment of FIG. 32, but the p emitter layer 1 was directly formed on the other surface (rear surface) of the n base layer 3. The thickness of the n base layer 3 was 350 μm. The lifetime of carriers was controlled by irradiation of protons.

The graph of FIG. 36 shows a trade-off characteristic of the ON-state voltage and turn-off time of the insulated gate thyristor of the twenty-sixth embodiment of the present invention, and those of 2500 V-class devices of the IGBT and EST-3 as comparative examples. The axis of abscissa indicates the ON-state voltage, and the axis of ordinates indicates the turn-off time. The ON-state voltage is defined by a fall of potential occurring at 25° C. upon conduction of current of 50 A.cm$^{-2}$. The turn-off time was measured at 125° C. The device of the twenty-sixth embodiment showed a better trade-off characteristic than the IGBT and EST-3.

The reverse bias safe operation area (RBSOA) of the 2500 V-class device of the twenty-sixth embodiment subjected to the lifetime control by irradiation of protons was measured at 125° C., using the measuring circuit of FIG. 5. The result was about the same as that of the insulated gate thyristor of the seventh embodiment of FIG. 10. The ON-state voltage, defined by a fall of potential occurring upon conduction of 50 A.cm$^{-2}$ current, was 1.1 V.

It will be understood that the device using a bulk wafer, as well as the 600 V-class device using an epitaxial wafer, constructed according to the present invention, has a significantly increased RBSOA, greater breakdown withstand capability and reduced ON-state voltage, as compared with the conventional IGBT and EST.

Another specimen of insulated gate thyristor of the present invention was produced in which the lifetime of carriers was controlled by implantation of helium ions. This thyristor exhibited substantially the same characteristics as the twenty-sixth embodiment in which the lifetime control was effected by irradiation of protons.

Twenty-seventh Embodiment

FIG. 37 is a fragmentary plan view showing a semiconductor substrate of an insulated gate thyristor according to the twenty-seventh embodiment of the present invention, as seen through the gate electrodes 10, insulating film 14 and the cathode 11. In FIG. 37, the opposite edges of each gate electrode 10 are indicated by dotted lines, and the opposite edges of each cathode portion 11 are indicated by thin straight lines. The first p base regions 4 and second p base regions 6 outlined by thick lines are formed in the shape of stripes, such that these regions 4, 6 extend in parallel with each other. A stripe-like n emitter region 8 is formed in each of the second p base regions 6, and a strip-like n source region 7 and a series of rectangular n source regions 7 are formed in each of the first p base regions 4.

Figure 38A:
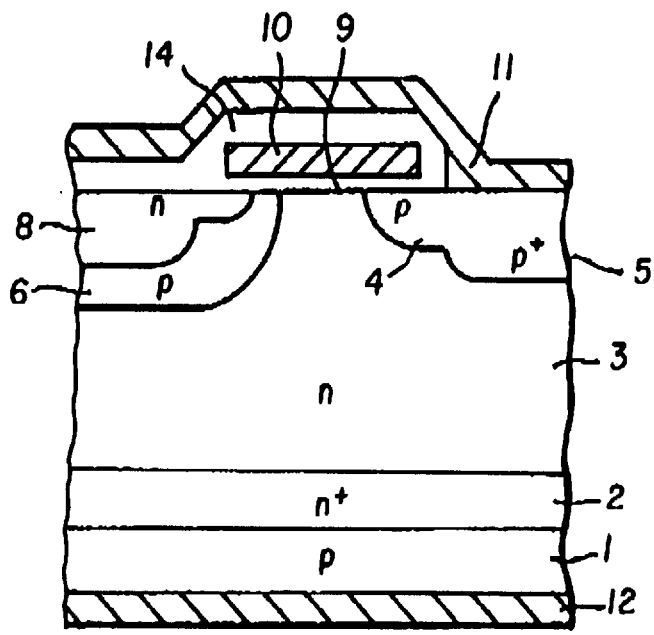
Figure 38B:
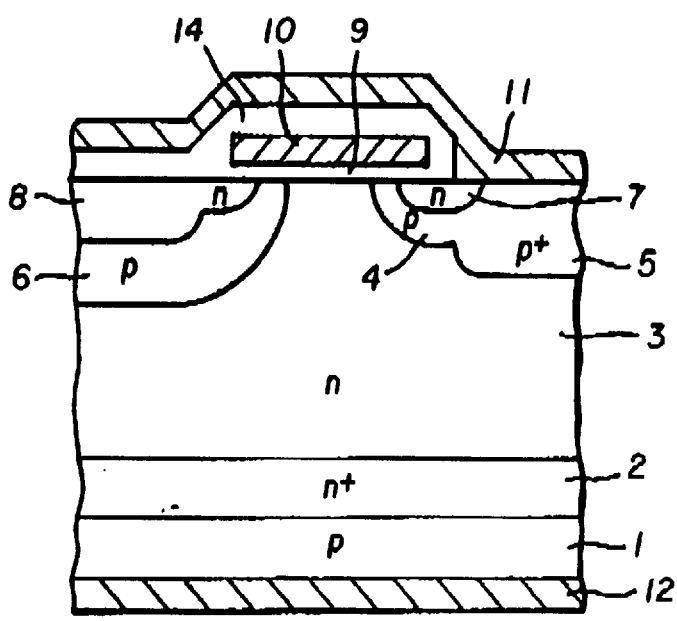

FIG. 38(a) is a cross sectional view taken along line G–G' of FIG. 37, and FIG. 38(b) is a cross sectional view taken along line H–H' of FIG. 37. The structure shown in cross section in FIG. 38(b) is almost identical with that of the insulated gate thyristor of the first embodiment of FIG. 1. Accordingly, this portion is operated in the same manner as the first embodiment of FIG. 1.

In the structure shown in cross section in FIG. 38(a), the n source region 7 is not formed in a surface layer of the first p base region 4. Upon application of voltage to the gate electrode 10, therefore, electrons are not fed from the cathode 11 to the n base layer 3, through this region 4. At the time of turn off, on the other hand, this region 4 functions as a hole for drawing carriers, whereby the parasitic thyristor is given increased resistance to latch-up. Accordingly, the resulting insulated gate thyristor has a relatively wide safe operation area, short turn-off time and large controllable current.

The insulated gate thyristor of FIG. 37 can be fabricated in substantially the same process as the IGBT, using different masks for forming diffusion regions.

Twenty-eighth Embodiment

FIG. 39 shows respective diffusion regions in a surface of a silicon substrate of an insulated gate thyristor according to the twenty-eighth embodiment of the present invention, from which the insulating film and electrodes are removed. Each of hexagonal second p base regions 6 formed in a surface layer of the n base layer 3 is surrounded by six hexagonal first p base regions, and this pattern is repeated over the substrate surface. A hexagonal n emitter region 8 is formed in a surface layer of each of the second p base regions 6, and trapezoidal n source regions 7 are formed in a surface layer of each of the first p base regions 4. A p$^+$ well region 5 is formed in the surface layer of the first p base region 4, such that a part of the p$^+$ well region 5 overlaps the n source regions 7. In FIG. 39, hexagonal portions defined by thin lines within the first p base regions 4 indicate contact areas of the regions 4, 5 with the cathode 11. The surfaces of the second p base regions 6 and the n emitter regions 8 are covered with the insulating film, and do not contact the cathode 11. The cross sectional view taken along line I–I' of FIG. 39 is identical with that of FIG. 38(a), and the cross sectional view taken along line J–J' of FIG. 39 is identical with that of FIG. 38(b). Thus, the turn-off time of the insulated gate thyristor having a polygonal cell pattern can be also reduced, by providing a plurality of n source regions 7 in each cell.

Twenty-ninth Embodiment

FIG. 40 shows respective diffusion regions in a surface of a silicon substrate of an insulated gate thyristor according to the twenty-ninth embodiment of the present invention, from which the insulating film and electrodes are removed. Each of hexagonal second p base regions 6 formed in a surface layer of the n base layer 3 is surrounded by six hexagonal first p base regions 4, and this pattern is repeated over the substrate surface. Hexagonal n source regions 7 with hexagonal holes are formed in surface layers of some of the first p base regions 4, and hexagonal n emitter regions 8 are formed in surface layers of the second p base regions 6. A p$^+$ well region 5 is formed within the n source region 7. Other first p base regions 4' do not have n source regions 7 formed therein. The cross sectional view taken along line K–K' of FIG. 40 is the same as that of FIG. 38(a), and the cross sectional view taken along line L–L' is the same as that of FIG. 38(b).

The insulated gate thyristor of FIG. 40 can be fabricated in almost the same process as the IGBT, using different masks for forming the diffusion regions. A specimen of 600 V-class insulated gate thyristor was produced, using the epitaxial wafer as used in the previous embodiments, such that the n source regions 7 had a width of 4 μm. The lifetime of carriers was controlled by irradiation of protons, under the same conditions as described above. The ON-state voltage at 100 A.cm$^{-2}$ was 0.9 V.

The reverse bias safe operation area of this specimen was measured, and turned out to be three times as large as that of IGBT and twice as large as that of the EST-3. Thus, the device of the present embodiment has a high breakdown withstand capability.

The graph of FIG. 41 shows a trade-off characteristic between the ON-state voltage and the turn-off time of the insulated gate thyristor of the twenty-ninth embodiment of the invention as shown in FIG. 40, and those of IGBT and EST-3 as comparative examples. The axis of abscissa indicates the ON-state voltage, and the axis of ordinates indicates the turn-off time. The ON-state voltage was defined by a fall of potential occurring at 25° C. upon conduction current of 100 A.cm$^{-2}$. The turn-off time was measured at 125° C.

As is understood from FIG. 41, the insulated gate thyristor of the twnety-ninth embodiment of the invention shows a better trade-off characteristic than the IGBT and EST-3. This is because the first p base region 4' having no n source region 7 formed in its surface layer functions as a hole for drawing out carriers, whereby the parasitic thyristor is given increased resistance to latch up. Accordingly, the insulated gate thyristor thus obtained assures a large safe operation area, a short turn-off time, and a large controllable current. In particular, if the width of the gate electrode located above the first p base region 4' having no n source region is reduced, a contact area of the region 4' with the cathode 11 is increased, thus increasing the effect of drawing out the carriers.

With the surfaces of the second p base region 6 and the n emitter region 8 covered with the insulating film 14, the insulated gate thyristor of this twenty-ninth embodiment is rapidly shifted from the IGBT mode to the thyristor mode, without requiring the hole current flowing in the Z direction in the second p base region as in the conventional EST. Further, the ON-state voltage is reduced due to uniform injection of electrons from the overall n emitter region 8. At the time of turn off, the pn junction between the n emitter region 8 and the second base region 6 uniformly resumes its reverse-blocking ability due to the potential difference therebetween, without causing current concentration.

The relatively low ON-state voltage is achieved since the lifetime of carriers is controlled by irradiation of protons, so that the crystal defects which provide lifetime killers are localized, to optimize distribution of the lifetime killers.

Another specimen in which the lifetime control was effected by implantation of helium ions showed almost the same characteristics as the twenty-ninth embodiment subjected to irradiation of protons.

Thirtieth Embodiment

While the n$^+$ buffer layer 2 is provided between the p emitter layer 1 and the n base layer 3 in the twenty-ninth embodiment having the cross sectional structures as shown in FIGS. 38(a) and 38(b), the present invention is also applicable to a similar device having no n$^+$ buffer layer 2. An insulated gate thyristor was fabricated as the thirtieth embodiment, such that the structure on one of major surfaces of the n emitter layer 3 formed from a bulk silicon wafer was such as shown in FIGS. 38(a) and 38(b), but the p emitter layer was directly formed on the other surface of the n base layer 3. The thickness of the n base layer 3 was 350 μm. The lifetime of carriers was controlled by irradiation of protons. Another specimen was also prepared wherein the lifetime control was effected by injection of helium ions.

The graph of FIG. 42 shows a trade-off characteristic between the ON-state voltage and the turn-off time of the insulated gate thyristor of the thirtieth embodiment having the pattern of FIG. 40, and those of 2500 V-class devices of the IGBT and EST-3 as comparative examples. The axis of abscissa indicates the ON-state voltage, and the axis of ordinates indicates the turn-off time. The ON-state voltage is defined by a fall of potential occurring at 25° C. upon conduction of current of 50 A.cm$^{-2}$. The turn-off time was measured at 125° C.

It will be understood from FIG. 42 that the device of the thirtieth embodiment shows a better trade-off characteristic than those of the IGBT and EST-3. This is because the first p base region 4' having no n source region 7 formed in its surface layer functions as a hole for drawing carriers, whereby the parasitic thyristor becomes less likely to latch up.

The reverse bias safe operation area (RBSOA) of the 2500-class device of the thirtieth embodiment in which the lifetime control was effected by irradiation of protons was measured at 125° C., using the measuring circuit of FIG. 5. The result was about the same as that of the insulated gate thyristor of the seventh embodiment of FIG. 10. The ON-voltage as defined by a fall of potential upon conduction of 50 A.cm$^{-2}$ was 1.1 V.

It will be understood that the present device using the bulk wafer, as well as the 600 V-class device using the epitaxial wafer, constructed according to the present invention, has a significantly increased reverse bias safe operation area (RBSOA), relatively high breakdown withstand capability and low ON-state voltage, as compared with the conventional IGBT and EST.

Namely, the effects of the present invention do not vary depending upon the resistivity of the n base layer and the current amplification factor of the pnp wide base transistor. In other words, the present invention is effective to reduce the ON-state voltage and increase the RBSOA, without regard to a rate voltage of the device, and a method of producing a semiconductor crystal of the substrate of the device.

Although the first and second conductivity types are n type and p type, respectively, in the illustrated embodiments, the first conductivity type may be p type and the second conductivity type may be n type.

The conventional EST is shifted from the IGBT mode to the latch-up state, using a fall of potential obtained by the current flowing in the Z direction. According to the present invention, on the other hand, a rise in the potential of the second second-conductivity-type base layer due to the hole current is utilized to switch the device to the thyristor mode, and uniformly resume the pn junction at the time of turn off, whereby the controllable current is increased.

The first and second second-conductivity-type base regions may be in the form of stripes that extend in parallel with each other, or may have a polygonal, circular or elliptical shape. If the first second-conductivity-type base region is disposed so as to surround the second second-conductivity type base region, the current concentration can be avoided, with a result of an improved trade-off characteristic. A plurality of first second-conductivity-type base regions may be advantageously formed around the second second-conductivity-type base region. It is also possible to embed the gate electrode in a trench to provide a trench gate type thyristor.

The current concentration can also be avoided by other methods, including: varying the width of the gate electrode from portion to portion; forming a high-impurity-concentration auxiliary region in a part of the surface layer of the first conductivity-type base layer; disconnecting the first-conductivity-type source region below an edge of the gate electrode; covering a surface of the first-conductivity-type source region that is close to the second second-conductivity-type base region, with the insulating film, and contacting a surface of the first-conductivity-type source region remote from the second second-conductivity-type base region, with the cathode; and providing first second-conductivity-type base regions having no first-conductivity-type source regions. These methods are effective to avoid the current concentration, prevent the parasitic thyristor from being operated at the time of turn off, and/or effectively draw out carriers to achieve a sufficiently short turn-off time.

The device in which lifetime killers are localized by irradiation of protons or implantation of helium ions exhibits a further improved trade-off characteristic.

As described above, the voltage-driven-type insulated gate thyristor constructed according to the present invention shows a better trade-off characteristic between the ON-state voltage and turn-off time than those of the EST and IGBT, and provides a large reverse bias safe operation area, over a wide withstand voltage range of 600 V through 2500 V. The above-described methods are advantageously used to further improve these characteristics of the device.

The present invention not only improves the characteristics of the device, but also greatly contributes to reduction of switching losses in a power switching apparatus using this device.

What is claimed is:

1. An insulated gate thyristor comprising:
   a first-conductivity-type base layer of high resistivity;
   first and second second-conductivity-type base regions formed in spaced-apart selected areas of a surface layer of a first major surface of said first-conductivity-type base layer;
   a first-conductivity-type source region formed in a selected area of a surface layer of said first second-conductivity-type base region;
   a first-conductivity-type emitter region formed in a selected area of a surface layer of said second second-conductivity-type base region;
   a gate electrode formed on a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;
   an insulating film interposed between said gate electrode and said surface of said first second-conductivity-type base region, said exposed portion of said first-conductivity-type base layer and said surface of said second second-conductivity-type base region;
   a first main electrode in contact with both an exposed portion of said first second-conductivity-type base region and said first-conductivity-type source region;
   a second-conductivity-type emitter layer formed on a second major surface of said first-conductivity-type base layer; and
   a second main electrode in contact with said second-conductivity-type emitter layer;
   wherein said insulating film covers entire areas of surfaces of said second second-conductivity-type base region and said first-conductivity-type emitter region;
   wherein said first-conductivity-type base layers, said second second-conductivity-type base region, said first-conductivity-type emitter region and said second-conductivity-type emitter layer comprise a thyristor portion; and
   wherein said first second-conductivity-type base region and said first-conductivity-type source region in the surface layer thereof are formed so as to surround said second second-conductivity-type base region.

2. An insulated gate thyristor as defined in claim 1, wherein at least one of said first and second second-conductivity-type base regions, said first-conductivity-type emitter region and said first-conductivity-type source region has one of polygonal, circular and elliptical shapes.

3. An insulated gate thyristor as defined in claim 1, wherein said gate electrode has a generally annular portion for surrounding said insulating film on the surface of said second second-conductivity-type base region, said first main electrode being located on the side of said gate electrode opposite to said second second-conductivity-type base region, with said insulating film interposed between said gate electrode and said first main electrode.

4. An insulated gate thyristor as defined in claim 3, wherein a plurality of units each having said gate electrode having at least one discontinuity in a circumference thereof are formed so as to surround said second second-conductivity-type base region, such that said first second-conductivity-type base region, said first-conductivity-type source region and a cathode of one of said plurality of units are connected with corresponding ones of an adjacent unit thereof, through said at least one discontinuity.

5. An insulated gate thyristor comprising:
   a first-conductivity-type base layer of high resistivity;
   first and second second-conductivity-type base regions formed in spaced-apart selected areas of a surface layer of a first major surface of said first-conductivity-type base layer;
   a first-conductivity-type source region formed in a selected area of a surface layer of said first second-conductivity-type base region;
   a first-conductivity-type emitter region formed in a selected area of a surface layer of said second second-conductivity-type base region;
   a gate electrode formed on a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;
   an insulating film interposed between said gate electrode and said surface of said first second-conductivity-type base region, said exposed portion of said first-conductivity-type base layer and said surface of said second second-conductivity-type base region;
   a first main electrode in contact with both an exposed portion of said first second-conductivity-type base region and said first-conductivity-type source region;
   a second-conductivity-type emitter layer formed on a second major surface of said first-conductivity-type base layer; and
   a second main electrode in contact with said second-conductivity-type emitter layer;
   wherein said insulating film covers entire areas of surfaces of said second second-conductivity-type base region and said first-conductivity-type emitter region;
   wherein said first-conductivity-type base layer, said second second-conductivity-type base region, said first-conductivity-type emitter region and said second-conductivity-type emitter layer comprise a thyristor portion; and
   wherein a plurality of said first second-conductivity-type base regions and a plurality of said first-conductivity-type source regions are formed so as to surround said second second-conductivity-type base region.

6. An insulated gate thyristor as defined in claim 5, wherein said gate electrode has a generally annular portion for surrounding said insulating film on the surface of said second second-conductivity-type base region, said first main electrode being located on the side of said gate electrode opposite to said second second-conductivity-type base region, with said insulating film interposed between said gate electrode and said first main electrode.

7. An insulated gate thyristor as defined in claim 5, wherein at least one of said plurality of first second-conductivity-type base regions lack said first-conductivity-type source region in the surface layer thereof.

8. An insulated gate thyristor as defined in claim 7, wherein a first portion of said gate electrode located above said at least one of said plurality of first second-conductivity-type base regions lacking said first-conductivity-type source region in the surface layer thereof has a smaller width that a second portion of said gate electrode located above the rest of said plurality of first second-conductivity-type base regions having said first-conductivity-type source regions in the surface layers thereof.

9. An insulated gate thyristor as defined in claim 5, wherein a first portion of said first-conductivity-type source region that is close to said second second-conductivity-type base region is covered with said insulating film, and a second portion of said first-conductivity-type source region remote from said second second-conductivity-type base region is in contact with a cathode.

10. An insulated gate thyristor as defined in claim 5, wherein a contact area between said first main electrode, and said first second-conductivity-type base region and said first-conductivity-type source region is one of polygonal, circular and elliptical shapes.

11. An insulated gate thyristor as defined in claim 5, wherein a first portion of said gate electrode whose opposite ends are located above two of said first-conductivity-type source region has a larger width than a second portion of said gate electrode whose opposite ends are located above said first-conductivity-type source region and said first-conductivity-type emitter region, respectively.

12. An insulated gate thyristor as defined in claim 5, further comprising a first-conductivity-type auxiliary region formed in a part of the surface layer of said first-conductivity-type base layer that is directly under said insulating film in contact with said gate electrode, said first-conductivity-type auxiliary region having a higher impurity concentration than said first-conductivity-type base layer.

13. An insulated gate thyristor as defined in claim 5, wherein said second second-conductivity-type base region has a larger diffusion depth than said first second-conductivity-type base region, and said first-conductivity-type emitter region has a larger diffusion depth than said first-conductivity-type source region.

14. An insulated gate thyristor as defined in 5, wherein lifetime killers are present in localized areas of the thyristor.

15. An insulated gate thyristor comprising,
   a first-conductivity-type base layer of high resistivity;
   first and second second-conductivity-type base regions formed in spaced-apart selected areas of a surface layer of a first major surface of said first-conductivity-type base layer;
   a first-conductivity-type source region formed in a selected area of a surface layer of said first second-conductivity-type base region;
   a first-conductivity-type emitter region formed in a selected area of a surface layer of said second second-conductivity-type base region;
   a trench formed between said first-conductivity-type emitter region and said first-conductivity-type source region, such that said trench has a greater depth than said first and second second-conductivity-type base regions;

a gate electrode formed within said trench through a gate insulating film;

a first main electrode in contact with both an exposed portion of said first second-conductivity-type base region and said first-conductivity-type source region;

a second-conductivity-type emitter layer formed on a second major surface of said first-conductivity-type base layer;

a second main electrode in contact with said second-conductivity-type emitter layer; and an insulating film covering an entire area of a surface of said first-conductivity-type emitter region;

wherein said first-conductivity-type base layer, said second second-conductivity-type base region, said first-conductivity-type emitter region and said second-conductivity-type emitter layer comprise a thyristor portion; and wherein said first second-conductivity-type base region and said first-conductivity-type source region in the surface layer thereof are formed so as to surround said second second-conductivity-type base region.

16. An insulated gate thyristor as defined in claim 15, wherein at least one of said first and second second-conductivity-type base regions, said first-conductivity-type emitter region and said first-conductivity-type source region has one of polygonal, circular and elliptical shapes.

17. An insulated gate thyristor as defined in claim 15, wherein said gate electrode has a generally annular shape so as to surround said insulating film on the surface of said second second-conductivity-type base region, said first main electrode being located on the side of said gate electrode opposite to said second second-conductivity-type base region, with said insulating film interposed between said gate electrode and said first main electrode.

18. An insulated gate thyristor comprising:

a first-conductivity-type base layer of high resistivity;

first and second second-conductivity-type base regions formed in spaced-apart selected areas of a surface layer of a first major surface of said first-conductivity-type base layer;

a first-conductivity-type source region formed in a selected area of a surface layer of said first second-conductivity-type base region;

a first-conductivity-type emitter region formed in a selected area of a surface layer of said second second-conductivity-type base region;

a trench formed between said first-conductivity-type emitter region and said first-conductivity-type source region, such that said trench has a greater depth than said first and second second-conductivity-type base regions;

a gate electrode formed within said trench through a gate insulating film;

a first main electrode in contact with both an exposed portion of said first second-conductivity-type base region and said first-conductivity-type source region;

a second-conductivity-type emitter layer formed on a second major surface of said first-conductivity-type base layer;

a second main electrode in contact with said second-conductivity-type emitter layer; and an insulating film covering an entire area of a surface of said first-conductivity-type emitter region;

wherein said first-conductivity-type base layer, said second second-conductivity-type base region, said first-conductivity-type emitter region and said second-conductivity-type emitter layer comprise a thyristor portion; and wherein a plurality of said first second-conductivity-type base regions and a plurality of said first-conductivity-type source regions are formed so as to surround said second second-conductivity-type base region.

19. An insulated gate thyristor as defined in claim 18, wherein at least one of said plurality of first second-conductivity-type base regions lack said first-conductivity-type source region in the surface layer thereof.

20. An insulated gate thyristor as defined in claim 18, wherein a first portion of said first-conductivity-type source region that is close to said second second-conductivity-type base region is covered with said insulating film, and a second portion of said first-conductivity-type source region remote from said second second-conductivity-type base region is in contact with a cathode.

21. An insulated gate thyristor as defined in claim 18, wherein a contact area between said first main electrode, and said first second-conductivity-type base region and said first-conductivity-type source region is one of polygonal, circular and elliptical shapes.

22. An insulated gate thyristor as defined in claim 18, wherein said second second-conductivity-type base region has a larger diffusion depth than said first second-conductivity-type base region, and said first-conductivity-type emitter region has a larger diffusion depth than said first-conductivity-type source region.

23. An insulated gate thyristor as defined in 18, wherein lifetime killers are present in localized areas of the thyristor.

24. An insulated gate thyristor as defined in claim 5, wherein at least one of said first and second second-conductivity-type base regions, said first-conductivity-type emitter region and said first-conductivity-type source region has one of polygonal, circular and elliptical shapes.

25. An insulated gate thyristor as defined in claim 5, wherein said first and second second-conductivity-type base regions are hexagonal.

26. An insulated gate thyristor as defined in claim 5, wherein each of said first second-conductivity-type base regions includes said first-conductivity-type source region located at a position that faces an adjacent one of said first second-conductivity-type base regions.

27. An insulated gate thyristor as defined in claim 26, wherein said first and second second-conductivity-type base regions are hexagonal.

* * * * *